US012562709B2

(12) United States Patent
Kai et al.

(10) Patent No.: US 12,562,709 B2
(45) **Date of Patent: \*Feb. 24, 2026**

(54) ACOUSTIC WAVE DEVICE

(71) Applicant: Murata Manufacturing Co., Ltd.,
Nagaokakyo (JP)

(72) Inventors: Seiji Kai, Nagaokakyo (JP); Hisashi Yamazaki, Nagaokakyo (JP); Takeshi Nakao, Nagaokakyo (JP); Takuya Koyanagi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 183 days.

This patent is subject to a terminal disclaimer.

(21) Appl. No.: 18/369,893

(22) Filed: Sep. 19, 2023

(65) Prior Publication Data

US 2024/0007076 A1      Jan. 4, 2024

Related U.S. Application Data

(63) Continuation of application No. PCT/JP2022/011662, filed on Mar. 15, 2022.

(Continued)

(51) Int. Cl.
H03H 9/02       (2006.01)
H03H 9/13       (2006.01)
H03H 9/17       (2006.01)

(52) U.S. Cl.
CPC .... H03H 9/02228 (2013.01); H03H 9/02015 (2013.01); H03H 9/131 (2013.01); H03H 9/173 (2013.01)

(58) Field of Classification Search
CPC ........... H03H 9/02228; H03H 9/02015; H03H 9/131; H03H 9/173; H03H 9/02062;
(Continued)

(56) References Cited

U.S. PATENT DOCUMENTS

2004/0188786 A1      9/2004   Bar-Sadeh et al.
2004/0233020 A1*   11/2004   Nakamura ......... H03H 9/02952
                                                          333/195
(Continued)

FOREIGN PATENT DOCUMENTS

JP        2004320784 A      11/2004
JP        2006521211 A        9/2006
(Continued)

OTHER PUBLICATIONS

International Search Report in PCT/JP2022/011662, mailed May 31, 2022, 3 pages.
(Continued)

*Primary Examiner* — Jorge L Salazar, Jr.
(74) *Attorney, Agent, or Firm* — Keating & Bennett, LLP

(57) ABSTRACT

An acoustic wave device includes a piezoelectric substrate including a support including a support substrate and a piezoelectric layer on the support, a functional electrode on the piezoelectric layer, at least one support, and a lid. One of the at least one support surrounds the functional electrode on the piezoelectric substrate and the lid is provided on the support. A first cavity is provided in the support. The first cavity overlaps at least a portion of the functional electrode in plan view. A second cavity is surrounded by the piezoelectric substrate, a support provided between the piezoelectric substrate and the lid, and the lid. A height of the first cavity is greater than a height of the second cavity.

42 Claims, 14 Drawing Sheets

Related U.S. Application Data

(60) Provisional application No. 63/195,799, filed on Jun. 2, 2021, provisional application No. 63/168,312, filed on Mar. 31, 2021, provisional application No. 63/168,317, filed on Mar. 31, 2021.

(58) Field of Classification Search

CPC ............. H03H 9/02157; H03H 9/0514; H03H 9/1035; H03H 9/174; H03H 9/25; H03H 9/02574; H03H 9/1071; H03H 9/14541; H03H 9/17

USPC .................................. 333/186–188, 193–196

See application file for complete search history.

(56) References Cited

U.S. PATENT DOCUMENTS

| | | | |
|---|---|---|---|
| 2004/0257171 | A1 | 12/2004 | Park et al. |
| 2007/0013268 | A1 | 1/2007 | Kubo et al. |
| 2017/0358730 | A1 | 12/2017 | Kishimoto et al. |
| 2020/0252049 | A1* | 8/2020 | Fujii ................... H01L 23/3121 |
| 2020/0321939 | A1 | 10/2020 | Turner et al. |
| 2021/0105002 | A1* | 4/2021 | Yantchev ........... H03H 9/02015 |
| 2021/0242855 | A1 | 8/2021 | Luo |
| 2022/0247373 | A1* | 8/2022 | Kay ......................... H03H 9/13 |

FOREIGN PATENT DOCUMENTS

| | | | |
|---|---|---|---|
| JP | 2010278972 | A | 12/2010 |
| JP | 2017224890 | A | 12/2017 |
| WO | 2004105237 | A1 | 12/2004 |
| WO | 2021012377 | A1 | 1/2021 |

OTHER PUBLICATIONS

Written Opinion in PCT/JP2022/011662, mailed May 31, 2022, 3 pages.

* cited by examiner

FIG. 17
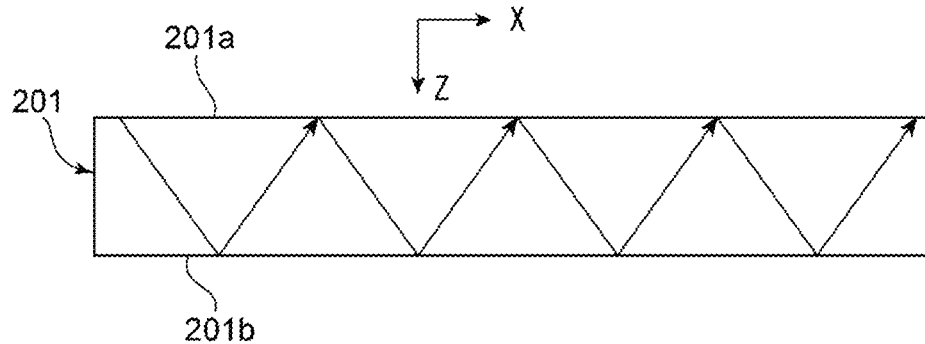
FIG. 18A
FIG. 18B
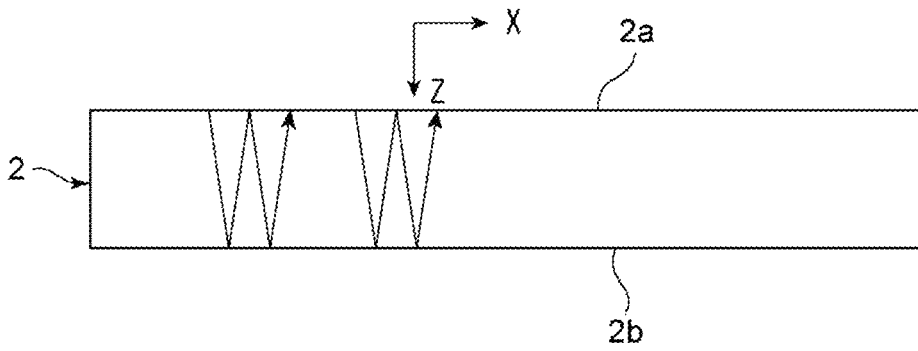

AREA OF FORMULA (2)

AREA OF FORMULA (1)

AREA OF FORMULA (3)

AREA OF FORMULA (2)

ACOUSTIC WAVE DEVICE

CROSS REFERENCE TO RELATED APPLICATIONS

This application claims the benefit of priority to Provisional Patent Application Nos. 63/168,312 and 63/168,317 filed on Mar. 31, 2021 and Provisional Patent Application No. 63/195,799 filed on Jun. 2, 2021, and is a Continuation Application of PCT Application No. PCT/JP2022/011662 filed on Mar. 15, 2022. The entire contents of each application are hereby incorporated herein by reference.

BACKGROUND OF THE INVENTION

1. Field of the Invention

The present invention relates to an acoustic wave device.

2. Description of the Related Art

Acoustic wave devices have been widely used in filters of mobile phone devices and the like. The acoustic wave device disclosed in Japanese Unexamined Patent Application Publication No. 2010-278972 includes a piezoelectric substrate, a support provided on the piezoelectric substrate, and a cover member provided on the support. A hollow space enclosed by the piezoelectric substrate, the support, and the cover member is provided in the acoustic wave device. An interdigital transducer (IDT) electrode is provided on the piezoelectric substrate so as to face the hollow space.

In Japanese Unexamined Patent Application Publication No. 2017-224890, a recess is provided in the top surface of the support. A piezoelectric thin film is provided on the support so as to cover the recess. In other words, the hollow space is provided on a side where the support is located. The IDT electrode is provided on a portion of the piezoelectric thin film that covers the recess.

In acoustic wave devices such as that described in Japanese Unexamined Patent Application Publication No. 2017-224890, a package structure such as that described in Japanese Unexamined Patent Application Publication No. 2010-278972 is sometimes used. However, in such an acoustic wave device, the piezoelectric thin film bends toward the hollow space provided on the side where the support is located, and this may result in sticking in which the piezoelectric thin film sticks to the support.

SUMMARY OF THE INVENTION

Preferred embodiments of the present invention provide acoustic wave devices that are each able to reduce or prevent sticking of a piezoelectric layer to a support.

An acoustic wave device according to a preferred embodiment of the present invention includes a piezoelectric substrate that includes a support including a support substrate and a piezoelectric layer on the support, a functional electrode on the piezoelectric layer, at least one support, and a lid. One of the at least one support surrounds the functional electrode on the piezoelectric substrate and the lid is on the support. The support includes a first cavity overlapping at least a portion of the functional electrode in plan view. A second cavity is surrounded by the piezoelectric substrate, the support, and the lid, the support being provided between the piezoelectric substrate and the lid. A height of the first cavity is greater than a height of the second cavity, when a height direction in which the piezoelectric substrate, the support between the piezoelectric substrate and the lid, and the lid are stacked and a height is a dimension in the height direction.

According to preferred embodiments of the present invention, sticking of the piezoelectric layer to a support is able to be reduced or prevented.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 17 is a sectional view taken along line A-A in FIG. 16A.

FIG. 18A is a schematic elevational cross-sectional view for describing a Lamb wave propagating through a piezoelectric film in an acoustic wave device, and FIG. 18B is a schematic elevational cross-sectional view for describing a thickness-shear mode bulk wave propagating through a piezoelectric film in an acoustic wave device.

DETAILED DESCRIPTION OF THE PREFERRED EMBODIMENTS

The present invention will be made clearer by describing preferred embodiments of the present invention with reference to the drawings.

The preferred embodiments described in the present specification are illustrative examples and portions of the configurations illustrated in different preferred embodiments can be substituted for one another or combined with one another.

Figure 1:
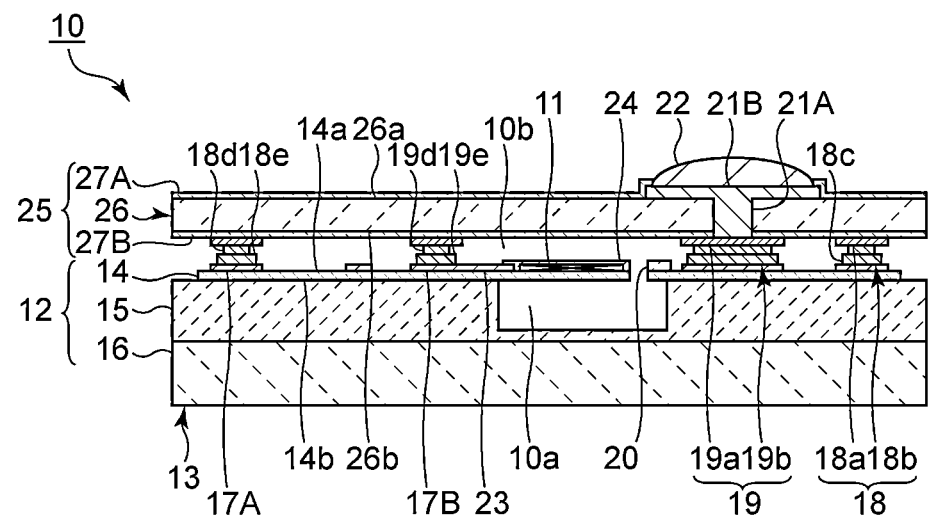
FIG. 1 is a schematic elevational cross-sectional view of an acoustic wave device according to a First Preferred Embodiment of the present invention.
Figure 2:
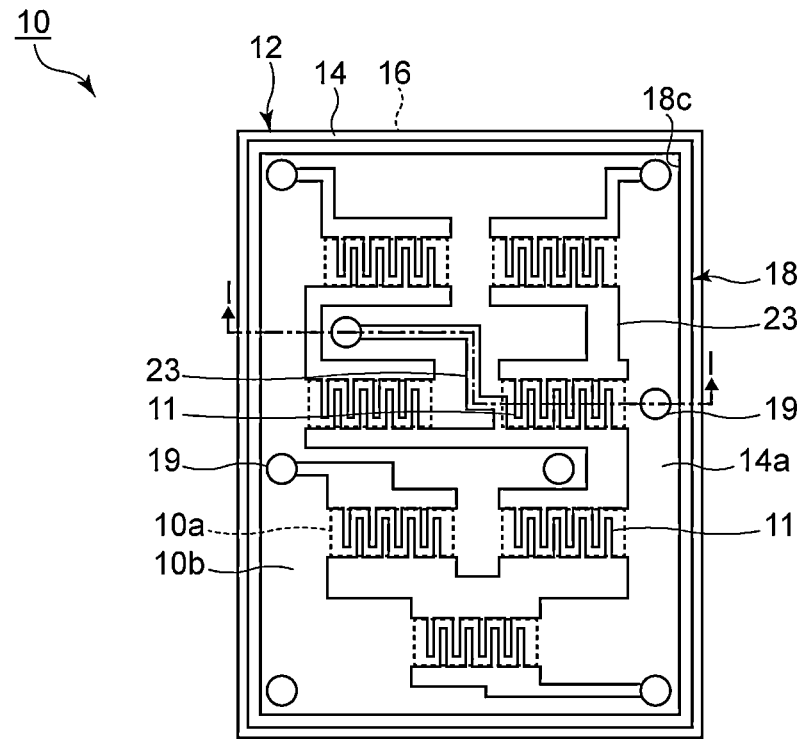
FIG. 2 is a schematic plan view illustrating the configuration of the acoustic wave device according to the First Preferred Embodiment of the present invention on a piezoelectric substrate.

FIG. 1 is a schematic elevational cross-sectional view of an acoustic wave device according to a First Preferred Embodiment of the present invention. FIG. 2 is a schematic plan view illustrating the configuration of the acoustic wave device according to the First Preferred Embodiment on a piezoelectric substrate.

In FIG. 1, an IDT electrode, which is described below, is illustrated as a rectangle with two added diagonal lines as an abbreviated illustration. This also applies to schematic sectional views other than FIG. 1. In FIG. 2, a dielectric film, which is described later, is omitted. This also applies to schematic plan views other than FIG. 2. FIG. 1 is a sectional view schematically illustrating a portion along line I-I in FIG. 2.

As illustrated in FIG. 1, an acoustic wave device 10 includes a piezoelectric substrate 12 and IDT electrodes 11 as functional electrodes. The piezoelectric substrate 12 includes a support 13 and a piezoelectric layer 14. In the present preferred embodiment, the support 13 includes a support substrate 16 and an intermediate layer 15. The intermediate layer 15 is provided on the support substrate 16. The piezoelectric layer 14 is provided on the intermediate layer 15. However, the support 13 may include only the support substrate 16.

The piezoelectric layer 14 includes a first main surface 14a and a second main surface 14b. The first main surface 14a and the second main surface 14b face each other. Of the first main surface 14a and the second main surface 14b, the second main surface 14b is located on the side adjacent to the support 13.

For example, a semiconductor such as silicon or a ceramic such as aluminum oxide can be used as the material of the support substrate 16. A suitable dielectric, such as, for example, silicon oxide or tantalum pentoxide, can be used as the material of the intermediate layer 15. For example, lithium niobate, lithium tantalate, zinc oxide, aluminum nitride, quartz, or lead zirconate titanate (PZT) can be used as the material of the piezoelectric layer 14. The piezoelectric layer 14 is preferably, for example, a lithium tantalate layer such as a LiTaO₃ layer or a lithium niobate layer such as a LiNbO₃ layer.

A first cavity 10a is provided in the support 13. More specifically, a recess is provided in the intermediate layer 15. A piezoelectric layer 14 is provided on the intermediate layer 15 so as to cover the recess. Thus, the first cavity 10a is provided. The first cavity 10a may be provided in the intermediate layer 15 and the support substrate 16, or may be provided in only the support substrate 16. It is sufficient that at least one first cavity 10a is provided in the support 13.

As illustrated in FIG. 2, a plurality of IDT electrodes 11 are provided on the first main surface 14a of the piezoelectric layer 14. Thus, a plurality of acoustic wave resonators are provided. In the present preferred embodiment, the acoustic wave device 10 is, for example, a filter device. It is sufficient that the acoustic wave device 10 includes at least one IDT electrode 11. It is sufficient that the acoustic wave device according to the present invention includes at least one acoustic wave resonator.

In plan view, at least a portion of an IDT electrode 11 overlaps a first cavity 10a. More specifically, as illustrated in FIG. 2, in the present preferred embodiment, a plurality of first cavities 10a are provided. In plan view, the IDT electrode 11 of each acoustic wave resonator overlaps a corresponding individual first cavity 10a. However, a plurality of IDT electrodes 11 may instead overlap the same first cavity 10a. In the present specification, "in plan view" means looking in a direction corresponding to a direction from above in FIG. 1. In addition, "in plan view" means looking in a direction in which a first support 18 and a lid 25, which are described later, are stacked. In FIG. 1, for example, of the support substrate 16 and the piezoelectric layer 14, the piezoelectric layer 14 is on the upper side.

The first support 18 and a plurality of second supports 19 are provided on the first main surface 14a of the piezoelectric layer 14. In the present preferred embodiment, the first support 18 and the second supports 19 are multilayer bodies each including a plurality of metal layers. The first support 18 has a frame shape. The second supports 19 each have a column shape. The first support 18 surrounds the plurality of IDT electrodes 11 and the plurality of second supports 19. More specifically, the first support 18 includes an opening 18c. The plurality of IDT electrodes 11 and the plurality of second supports 19 are located inside the opening 18c. It is sufficient that at least one second support 19 is provided.

As illustrated in FIG. 1, a frame-shaped electrode layer 17A is provided between the piezoelectric layer 14 and the first support 18. Similarly to the first support 18, the electrode layer 17A surrounds the plurality of IDT electrodes 11 and the plurality of second supports 19 in plan view. However, the electrode layer 17A does not have to be provided. The lid 25 is provided on the first support 18 and on the plurality of second supports 19 so as to close the opening 18c. As a result, a second cavity 10b is surrounded by the piezoelectric substrate 12, the electrode layer 17A, the first support 18, and the lid 25. The plurality of IDT electrodes 11 and the plurality of second supports 19 are disposed inside the second cavity 10b.

A feature of the present preferred embodiment is that the height of the first cavity 10a is greater than the height of the second cavity 10b when the direction in which the piezoelectric substrate 12, the first support 18, and the lid 25 are stacked is a height direction and dimensions along the height direction are heights. As a result, sticking in which the piezoelectric layer 14 sticks to the support 13 can be reduced or prevented even when the piezoelectric layer 14 deforms convexly from the second cavity 10b side toward the first cavity 10a side.

Next, the configuration of the present preferred embodiment will be described in further detail.

As illustrated in FIG. 1, a dielectric film 24 is provided on the piezoelectric substrate 12 so as to cover the IDT electrodes 11. This makes it less likely that the IDT electrodes 11 will be damaged. For example, silicon oxide, silicon nitride, silicon oxynitride, or the like can be used as the material of the dielectric film 24. When the dielectric film 24 is made of silicon oxide, the frequency-temperature characteristics can be improved. On the other hand, when the dielectric film 24 is made of silicon nitride, the dielectric film 24 can be used as a frequency-adjusting film. The dielectric film 24 does not have to be provided.

A through hole 20 is provided in the piezoelectric layer 14 and the dielectric film 24 in a continuous manner. The through hole 20 extends to the first cavity 10a. The through hole 20 is used to remove a sacrificial layer from inside the intermediate layer 15 when manufacturing the acoustic wave device 10. However, the through hole 20 does not necessarily have to be provided.

The lid 25 includes a lid body 26, an insulator layer 27A, and an insulator layer 27B. The lid body 26 includes a first main surface 26a and a second main surface 26b. The first main surface 26a and the second main surface 26b face each other. Of the first main surface 26a and the second main surface 26b, the second main surface 26b is located on the side closer the piezoelectric substrate 12. The insulator layer 27A is provided on the first main surface 26a. The insulator layer 27B is provided on the second main surface 26b. In the present preferred embodiment, the lid body 26 includes, for example, silicon as a main component. The material of the lid body 26 is not limited to the material described above, and preferably includes, for example, a semiconductor such as silicon as a main component. In this specification, the term "main component" refers to a component accounting for more than 50 wt % of the total. The insulator layer 27A and the insulator layer 27B are, for example, silicon oxide layers.

The lid 25 includes via electrodes 21A, as underbump metals. More specifically, through holes are provided in the lid 25. The through holes extend to the second supports 19.

The via electrodes 21A are provided inside the through holes. One end of each via electrode 21A is connected to the corresponding second support 19. Electrode pads 21B are provided so as to be connected to the other ends of the via electrodes 21A. In the present preferred embodiment, the via electrodes 21A and the electrode pads 21B are provided so as to be integrated with each other. However, the via electrodes 21A and the electrode pads 21B may instead be provided as separate bodies. Bumps 22 are bonded to the electrode pads 21B.

In more detail, the insulator layer 27A covers the regions around the outer peripheral edges of the electrode pads 21B. The bumps 22 are bonded to the portions of the electrode pads 21B that are not covered by the insulator layer 27A. "Outer peripheral edge" in the present specification means the outer peripheral edge in plan view. The insulator layer 27A may extend between the electrode pads 21B and the lid body 26. The insulator layer 27A may extend between the via electrodes 21A and the lid body 26. The insulator layer 27A and the insulator layer 27B may be integrated with each other via through holes in the lid body 26.

As illustrated in FIG. 2, a plurality of wiring electrodes 23 are provided on the piezoelectric substrate 12. Some of the plurality of wiring electrodes 23 connect the IDT electrodes 11 to each other. Other ones of the plurality of wiring electrodes 23 electrically connect the IDT electrodes 11 and the second supports 19 to each other. More specifically, conductive films 17B are provided on the piezoelectric substrate 12 as illustrated in FIG. 1. The second supports 19 are provided on the conductive films 17B. Therefore, the wiring electrodes 23 are electrically connected to the second supports 19 via the conductive films 17B. The plurality of IDT electrodes 11 are electrically connected to the outside via the wiring electrodes 23, the conductive films 17B, the second supports 19, the via electrodes 21A, the electrode pads 21B, and the bumps 22. The plurality of second supports 19 may include second supports 19 that are not connected to the via electrodes 21A.

The first support 18 includes a first portion 18a and a second portion 18b. Of the first portion 18a and the second portion 18b, the first portion 18a is located on the side closer the lid 25 and the second portion 18b is located on the side closer to the piezoelectric substrate 12. In other words, the second portion 18b is located nearer the piezoelectric layer 14 in the height direction than the first portion 18a. In the present preferred embodiment, the second portion 18b is, for example, a multilayer body. More specifically, the second portion 18b includes a first layer 18d and a second layer 18e. On the other hand, the first portion 18a is, for example, a single metal layer.

In the first support 18, the first portion 18a and the first layer 18d of the second portion 18b are made of the same metal. The first portion 18a and the first layer 18d are bonded to each other. Thus, a first integrated portion includes the first portion 18a and the first layer 18d. On the other hand, the first layer 18d and the second layer 18e are made of different metals.

Similarly to the first support 18, the second supports 19 each include a first portion 19a and a second portion 19b. Of the first portion 19a and the second portion 19b, the first portion 19a is located on the side near the lid 25 and the second portion 19b is located on the side near the piezoelectric substrate 12. In the present preferred embodiment, the second portion 19b is a multilayer body. More specifically, the second portion 19b includes a first layer 19d and a second layer 19e. On the other hand, the first portion 19a is a single metal layer.

In each second support 19, the first portion 19*a* and the first layer 19*d* of the second portion 19*b* are made of the same metal. The first portion 19*a* and the first layer 19*d* are bonded to each other. Thus, a second integrated portion includes the first portion 19*a* and the first layer 19*d*. On the other hand, the first layer 19*d* and the second layer 19*e* are made of different metals.

Although there is no clear bonding interface in the first integrated portion, a bonding interface is shown in each sectional view for convenience. This also applies to the second integrated portion.

The first integrated portion and the second integrated portion are made of Au, for example. The second layer 18*e* of the second portion 18*b* of the first support 18 and the second layer 19*e* of the second portion 19*b* of each second support 19 are, for example, made of Al. In this specification, the meaning of "a member is made of a certain material" includes cases in which the member includes trace amounts of impurities that do not degrade the electrical characteristics of the acoustic wave device.

In the first support 18, the first portion 18*a* and the first layer 18*d* of the second portion 18*b* do not have to be made of the same metal. Similarly, in the second supports 19, the first portion 19*a* and the first layer 19*d* of the second portion 19*b* do not have to be made of the same metal. The second portion 18*b* of the first support 18 and the second portion 19*b* of each second support 19 do not have to be multilayer bodies.

Hereafter, a preferred configuration in the present preferred embodiment is described.

As illustrated in FIG. 1, the wiring electrodes 23 are preferably each provided so as to span across a portion of the piezoelectric layer 14 overlapping the first cavity 10*a* in plan view and a portion of the piezoelectric layer 14 not overlapping the first cavity 10*a* in plan view. This helps prevent the piezoelectric layer 14 from being deflected from the second cavity 10*b* side toward the first cavity 10*a* side. Therefore, it is possible to effectively reduce or prevent sticking of the piezoelectric layer 14 to the support 13.

The first portion 18*a* and the second portion 18*b* of the first support 18 preferably include different metals from each other. Similarly, the first portion 19*a* and the second portion 19*b* of each second support 19 preferably include different metals from each other. In these cases, stress is less likely to become concentrated in the piezoelectric layer 14. Therefore, deflection of the piezoelectric layer 14 from the second cavity 10*b* side toward the first cavity 10*a* side can be reduced or prevented. Therefore, sticking of the piezoelectric layer 14 to the support 13 can be further reduced or prevented.

The first portion 18*a* and the second portion 18*b* of the first support 18 do not have to include different metals from each other. The first portion 19*a* and the second portion 19*b* of each second support 19 do not have to include different metals from each other. Preferred embodiments of the present invention are particularly suitable in these cases since the piezoelectric layer 14 is more likely to bend from the second cavity 10*b* side toward the first cavity 10*a* side.

As illustrated in FIG. 2, it is preferable that the area of the second cavity 10*b* in plan view is larger than the area of each first cavity 10*a* in plan view. As a result, the fragility of the acoustic wave device 10 can be reduced without interfering with the excitation of acoustic waves.

"The area of the first cavity 10*a* in plan view" specifically refers to the total area of the first cavity 10*a* in plan view. When a plurality of first cavities 10*a* are provided, the total area of the plurality of first cavities 10*a* in plan view is the area of the first cavities 10*a* in plan view.

On the other hand, "the area of the second cavity 10*b* in plan view" refers to the area of the portion surrounded by the first support 18 in plan view. In the present preferred embodiment, at least one second support 19 is provided in the portion surrounded by the first support 18. In this case, the area of the second cavity 10*b* in plan view is the area in plan view of the portion surrounded by the first support portion 18 minus the area in plan view of the second support portion 19. Hereafter, the areas of the first and second cavities 10*a* and 10*b* in plan view may be simply referred to as areas.

The second supports 19 are preferably disposed so as to not overlap the first cavities 10*a* in plan view. As a result, fragility of the areas where the second supports 19 are provided can be more reliably reduced.

The conductive films 17B and the wiring electrodes 23 are preferably made of the same material. When the wiring electrodes 23 are connected to the conductive films 17B, the conductive films 17B and the wiring electrodes 23 are preferably provided so as to be integrated with each other. This enables productivity to be increased. The conductive films 17B do not have to be connected to the wiring electrodes 23.

As illustrated in FIG. 1, in the First Preferred Embodiment, the first support 18 and the second supports 19 are provided on the piezoelectric layer 14 of the piezoelectric substrate 12. However, at least a portion of the first support 18 may be provided on a portion of the piezoelectric substrate 12 where the piezoelectric layer 14 is not provided. Similarly, at least a portion of each second support 19 may be provided on a portion of the piezoelectric substrate 12 where the piezoelectric layer 14 is not provided. For example, at least a portion of the first support 18 or the second support 19 may be provided on the intermediate layer 15 or the support substrate 16.

Next, First to Fourth Modifications of the First Preferred Embodiment will be described. The First to Fourth Modifications differ from the First Preferred Embodiment only with respect to the arrangement of the dielectric film, the arrangement of the IDT electrodes, the arrangement of the second supports, or the arrangement of the wiring electrodes. Sticking of the piezoelectric layer to the support can be reduced or prevented in the First to Fourth Modifications as well. In addition, the fragility of the acoustic wave device can be reduced without interfering with the excitation of acoustic waves.

Figure 3:
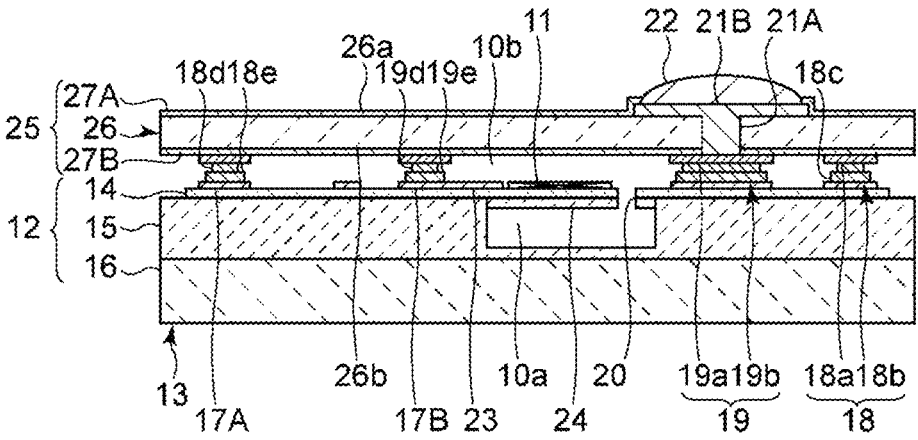
FIG. 3 is a schematic cross-sectional view illustrating a portion of the acoustic wave device according to a First Modification of the First Preferred Embodiment of the present invention corresponding to FIG. 1.

In the First Modification illustrated in FIG. 3, the dielectric film 24 is provided on the second main surface 14*b* of the piezoelectric layer 14 but is not provided on the first main surface 14*a* of the piezoelectric layer 14. The dielectric film 24 is positioned inside the first cavity 10*a*. The dielectric film 24 may be provided so as to be integrated with the intermediate layer 15. Alternatively, the dielectric film 24 and the intermediate layer 15 may be separately provided.

Figure 4:
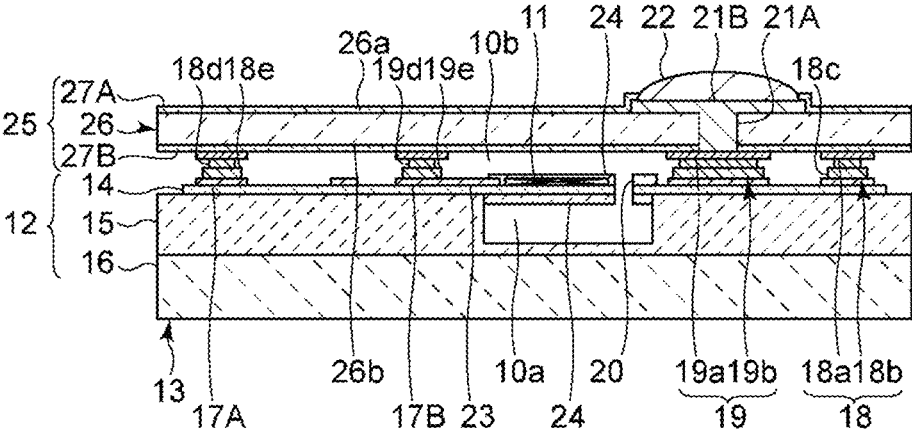
FIG. 4 is a schematic cross-sectional view illustrating a portion of the acoustic wave device according to a Second Modification of the First Preferred Embodiment of the present invention corresponding to FIG. 1.

In the Second Modification illustrated in FIG. 4, the dielectric film 24 is provided on both of the first main surface 14*a* and the second main surface 14*b* of the piezoelectric layer 14. The dielectric film 24 is preferably at least partially provided on a portion of at least one of the first main surface 14*a* and the second main surface 14*b* of the piezoelectric layer 14, the portion overlapping the first cavity 10*a* in plan view. Preferred embodiments of the present invention are particularly suitable in this case since the piezoelectric layer 14 is more likely to bend from the second cavity 10*b* side toward the first cavity 10*a* side.

Figure 5:
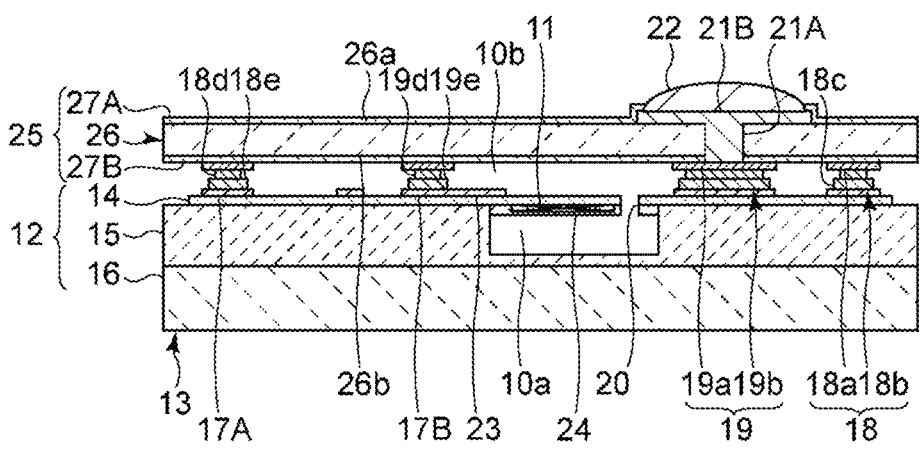
FIG. 5 is a schematic cross-sectional view illustrating the configuration of an acoustic wave device according to a Third Modification of the First Preferred Embodiment of the present invention on a piezoelectric substrate.

In the Third Modification illustrated in FIG. 5, the IDT electrodes 11 are provided on the second main surface 14*b* of the piezoelectric layer 14. The dielectric film 24 is provided on the second main surface 14*b* so as to cover the IDT electrodes 11.

Figure 6:
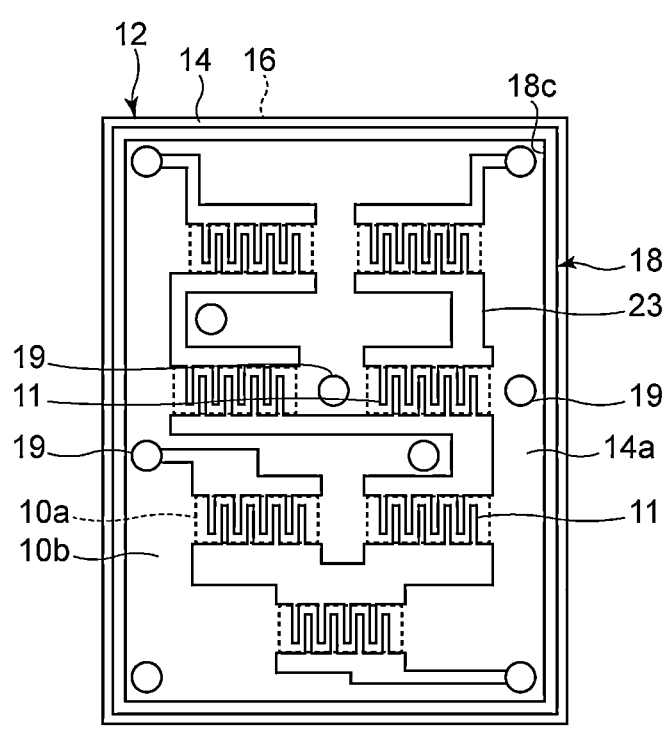
FIG. 6 is a schematic plan view illustrating a portion of the acoustic wave device according to a Fourth Modification of the First Preferred Embodiment of the present invention corresponding to FIG. 1.

In the Fourth Modification illustrated in FIG. 6, at least one pair of second supports 19 is provided so that an IDT electrode 11 is interposed therebetween. Preferred embodiments of the present invention are particularly suitable in this case since the piezoelectric layer 14 is more likely to bend from the second cavity 10*b* side toward the first cavity 10*a* side. In addition, heat generated in the IDT electrode 11 can be released to the outside via the at least one pair of second supports 19. Thus, heat dissipation can be improved.

As illustrated in FIG. 6, at least one second support 19 is preferably provided between the first support 18 and an IDT electrode 11. In this case, the second support 19 is not interposed between a plurality of IDT electrodes 11. Therefore, heat generated in one IDT electrode 11 can be effectively dissipated via the second support 19. This configuration is suitable when, for example, the IDT electrode 11 is particularly required to have an electric power handling capability.

In the First Preferred Embodiment, the lid body 26 includes a semiconductor as a main component. The lid 25 and the first support 18 are configured as separate members. The lid body 26 may be made of a resin. For example, in a Fifth Modification of the First Preferred Embodiment illustrated in FIG. 7, a first support 18A and a lid body 26A are made of resin, and the first support 18A and the lid body 26A are configured as a single member.

Figure 7:
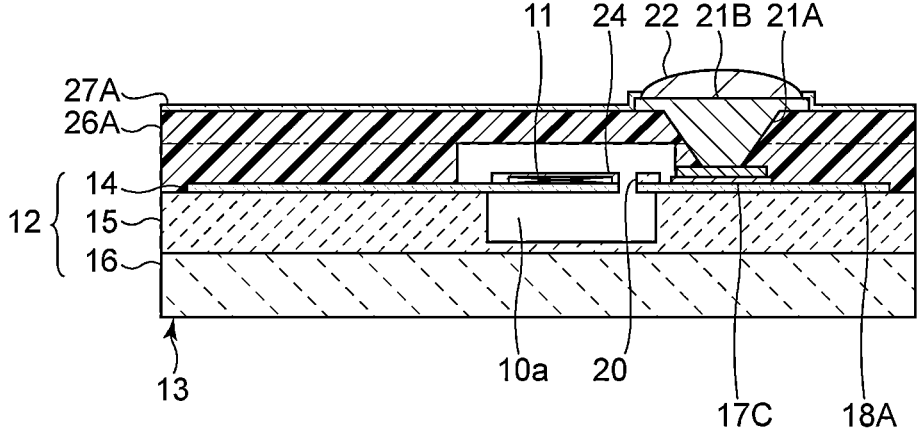
FIG. 7 is a schematic elevational cross-sectional view of an acoustic wave device according to a Fifth Modification of the First Preferred Embodiment of the present invention.

In other words, the first support 18A and the lid body 26A are defined by providing a recess in a resin layer. The recess overlaps an IDT electrode 11 in plan view. The recess is covered by the piezoelectric layer 14. Thus, a second cavity is provided. The single-dot chain line in FIG. 7 is a boundary line between the first support 18A and the lid body 26A.

Similarly to the First Preferred Embodiment, the insulator layer 27A is provided on the lid body 26A. On the other hand, in this modification, the insulator layer 27B is not provided. Furthermore, second supports are not provided. However, for example, at least one second support composed of resin may be provided so as to be integrated with the first support 18A and the lid body 26A. Alternatively, at least one second support may be provided similarly to as in the First Preferred Embodiment.

The via electrodes 21A extend through the lid body 26A and the first support 18A. One end of each via electrode 21A is connected to a conductive film 17C. The conductive film 17C includes two metal layers. However, the conductive film 17C may include a single metal layer similarly to as in the First Preferred Embodiment.

In this modification as well, the height of the first cavity 10*a* is greater than the height of the second cavity. In addition, the area of the second cavity is larger than the area of the first cavity 10*a*. Therefore, similarly to as in the First Preferred Embodiment, sticking of the piezoelectric layer 14 to the support 13 can be reduced or prevented. In addition, the fragility of the acoustic wave device can be reduced without interfering with the excitation of acoustic waves.

The configurations of the First to Fifth Modifications can also be applied to configurations other than that of the First Preferred Embodiment of the present invention.

Figure 8:
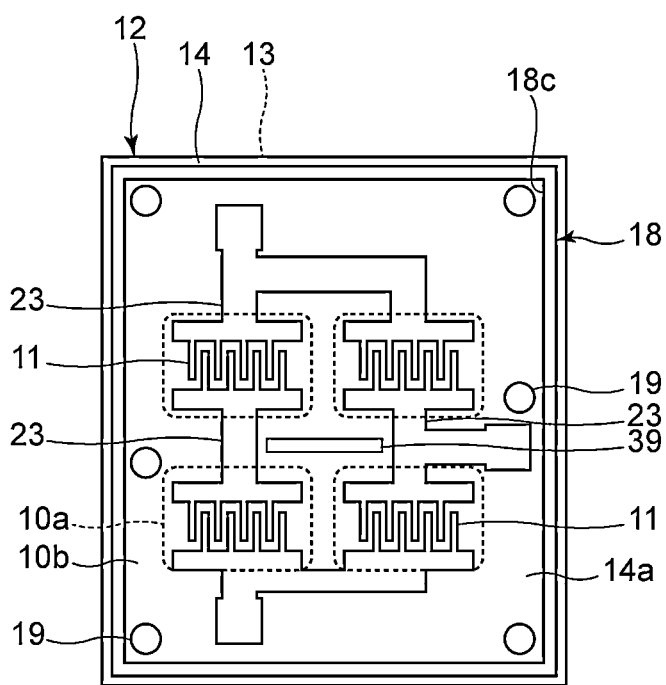
FIG. 8 is a schematic plan view illustrating the configuration of an acoustic wave device according to a Second Preferred Embodiment of the present invention on a piezoelectric substrate.

FIG. 8 is a schematic plan view illustrating the configuration of an acoustic wave device according to a Second Preferred Embodiment of the present invention on a piezoelectric substrate.

The present preferred embodiment differs from the First Preferred Embodiment with respect to the arrangements of the second supports 19, the IDT electrodes 11, and the first cavities 10*a*, and with respect to routing of wiring. The present preferred embodiment also differs from the First Preferred Embodiment in that a second support 39 is provided that has a different shape from that of the second supports 19. In other respects, the acoustic wave device of the present preferred embodiment has the same or substantially the same configuration as the acoustic wave device 10 of the First Preferred Embodiment.

The second support 39 has a wall shape. More specifically, the second support 39 has a rectangular or substantially rectangular shape in plan view. It is sufficient that the wall-shaped second support 39 include a portion shaped so as to extend in any one direction in plan view. The second support 39 may include a portion that is curved in plan view.

In the present preferred embodiment, the column-shaped second supports 19 specifically have a cylindrical or substantially cylindrical shape, for example. However, the second supports 19 may instead have a prism or substantially prism shape.

The second supports may have a wall shape or a column shape. In the First Preferred Embodiment, only column-shaped second supports 19 are provided as the second supports. In the present preferred embodiment, both the wall-shaped second support 39 and the column-shaped second supports 19 are provided as the second supports. However, just the wall-shaped second support 39 may be provided as a second support.

When the wall-shaped second support 39 is provided, the lid can be more securely supported. Therefore, for example, a configuration in which the second support 39 is provided is suitable when the lid is made of resin.

In the present preferred embodiment as well, the height of each first cavity 10*a* is greater than the height of the second cavity 10*b*. In addition, the area of the second cavity 10*b* is larger than the area of the first cavity 10*a*. Therefore, similarly to as in the First Preferred Embodiment, sticking of the piezoelectric layer 14 to the support 13 can be reduced or prevented. In addition, the fragility of the acoustic wave device can be reduced without interfering with the excitation of acoustic waves.

In the present preferred embodiment, the second support 39 is a multilayer body including a plurality of metal layers. However, the second support 39 may be made of resin. Examples of this are illustrated in a First Modification and a Second Modification of the Second Preferred Embodiment described below. In the First Modification and the Second Modification as well, similarly to as in the Second Preferred Embodiment, sticking of the piezoelectric layer 14 to the support 13 can be reduced or prevented. In addition, the fragility of the acoustic wave device can be reduced without interfering with the excitation of acoustic waves.

Figure 9:
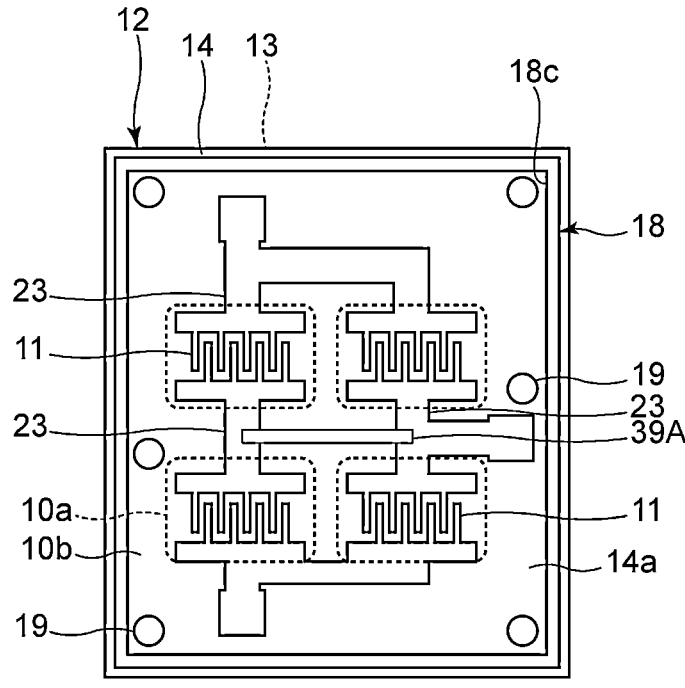
FIG. 9 is a schematic plan view illustrating the configuration of an acoustic wave device according to a First Modification of the Second Preferred Embodiment of the present invention on a piezoelectric substrate.

In the First Modification illustrated in FIG. 9, a second support 39A made of resin is provided so as to span between two wiring electrodes 23. More specifically, the second support 39A is provided so as to extend from the top of one wiring electrode 23, across the piezoelectric layer 14, and onto another wiring electrode 23. The two wiring electrodes 23 are connected to different potentials. In this case as well, since the second support 39A is made of resin, the second support 39A is unlikely to affect the electrical characteristics of the acoustic wave device. In addition, since the areas on the wiring electrodes 23 can be used as areas where the second support 39A is provided, the acoustic wave device can be easily reduced in size.

Figure 10:
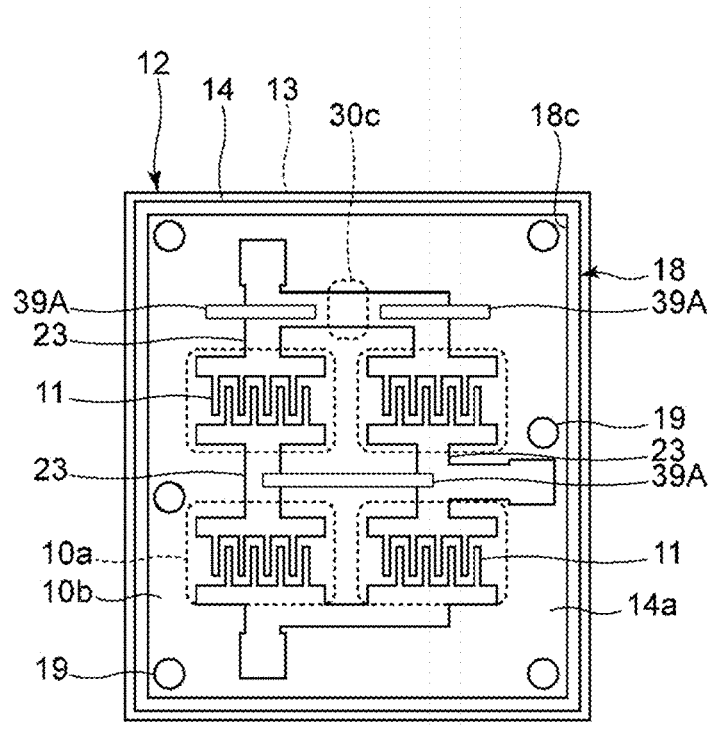
FIG. 10 is a schematic plan view illustrating the configuration of an acoustic wave device according to a Second Modification of the Second Preferred Embodiment of the present invention on a piezoelectric substrate.

In the Second Modification illustrated in FIG. 10, three second supports 39A are provided. One second support 39A is provided in the same or substantially the same manner as in the First Modification. The other two second supports 39A are each provided along the same wiring electrode 23 and piezoelectric layer 14.

In this modification, a third cavity 30*c* is provided between the two second supports 39A provided on the same wiring electrode 23 in plan view. The third cavity 30*c* is provided in the support 13 similarly to the first cavities 10*a*. The third cavity 30*c* and the first cavities 10*a* are not connected to each other. The third cavity 30*c* is provided in an independent manner.

The third cavity 30*c* does not overlap any of the IDT electrodes 11 in plan view. The third cavity 30*c* overlaps a wiring electrode 23 in plan view. This makes it easy to reduce the parasitic capacitance of the wiring electrode 23.

On the other hand, the third cavity 30*c* does not overlap any of the second supports 39A in plan view. As a result, fragility can be more reliably reduced even in the region where the third cavity 30*c* is provided.

Figure 11:
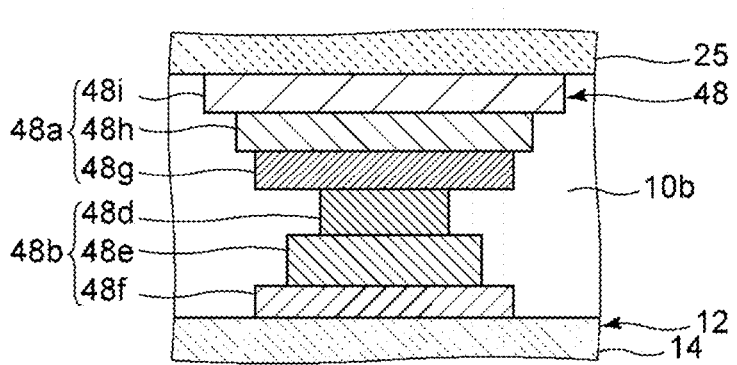
FIG. 11 is a schematic cross-sectional view illustrating the vicinity of a first support in a Third Preferred Embodiment of the present invention.

FIG. 11 is a schematic cross-sectional view illustrating the vicinity of a first support in a Third Preferred Embodiment of the present invention.

In the present preferred embodiment, a first support 48 has a different configuration from that in the First Preferred Embodiment. In other respects, the present preferred embodiment has the same or substantially the same configuration as the First Preferred Embodiment. Therefore, in the present preferred embodiment, similarly to as in the First Preferred Embodiment, the height of each first cavity is greater than the height of the second cavity. Therefore, sticking of the piezoelectric layer to the support can be reduced or prevented.

In the first support 48, both of a first portion 48*a* and a second portion 48*b* are multilayer bodies. Specifically, the first portion 48*a* includes a first layer 48*g*, a second layer 48*h*, and a third layer 48*i*. The second portion 48*b* includes a first layer 48*d*, a second layer 48*e*, and a third layer 48*f*. However, the number of layers of the first portion 48*a* and the second portion 48*b* may be 2 or 3 or more.

In the first portion 48*a*, the first layer 48*g*, the second layer 48*h*, and the third layer 48*i* are stacked in order. The first layer 48*g* is the portion of the first portion 48*a* that is closest to the second portion 48*b*. Similarly, in the second portion 48*b*, the first layer 48*d*, the second layer 48*e*, and the third layer 48*f* are stacked in order. The first layer 48*d* is the portion of the second portion 48*b* closest to the first portion 48*a*. A first integrated portion includes the first layer 48*g* of the first portion 48*a* and the first layer 48*d* of the second portion 48*b*.

Similarly to as in the First Preferred Embodiment, the first support 48 has a frame shape. In the present preferred embodiment, the first layer 48*g* of the first portion 48*a* and the first layer 48*d* of the second portion 48*b* have different widths from each other. Thus, the first layer 48*g* of the first portion 48*a* and the first layer 48*d* of the second portion 48*b* have different areas from each other in plan view. The width of each portion of the first support 48 is defined as follows. That is, the width is the dimension of each portion of the first support 48 in a direction perpendicular or substantially perpendicular to both the direction in which the piezoelectric substrate 12, the first support 48, and the lid 25 are stacked and the direction in which the first support 48 extends on the piezoelectric substrate 12.

The configuration of the first support 48 described above allows the strength of the first support 48 to be more reliably increased. In more detail, when manufacturing the acoustic wave device, for example, the first portion 48*a* of the first support 48 is provided on the lid 25. On the other hand, the second portion 48*b* of the first support 48 is provided on the piezoelectric substrate 12. Next, the first portion 48*a* and the second portion 48*b* are bonded to each other.

In reality, a misalignment may occur when bonding the first portion 48*a* and the second portion 48*b* of the first support 48 to each other. Regarding this point, in the present preferred embodiment, the first portion 48*a* and the second portion 48*b* have different areas from each other in plan view. Specifically, the first layer 48*g* of the first portion 48*a* and the first layer 48*d* of the second portion 48*b* have different areas from each other in plan view. This makes it easier to keep the bonding area of the first portion 48*a* and the second portion 48*b* constant.

More specifically, as long as the other layer of the first layer 48*g* of the first portion 48*a* and the first layer 48*d* of the second portion 48*b* is positioned inside the outer edge of the wider layer, the bonding area can be kept constant even if there is a misalignment. Therefore, the strength of the first support 48 can be more reliably increased. In supports including the first support and the second support in the preferred embodiments described in this specification, among adjacent layers, the layer having the smaller area is positioned inside the outer edge of the layer having the larger area in plan view.

Hereafter, the area of each portion of the first support 48 in plan view is simply referred to as area. In the second portion 48*b*, the areas of all of the layers other than the first layer 48*d* are larger than the area of the first layer 48*d*. Therefore, the area of the second layer 48*e* is larger than the area of the first layer 48*d*. Therefore, all of the portions of the first layer 48*d* can be easily provided on the second layer 48*e*. Consequently, the planar accuracy of the first layer 48*d* can be improved. Therefore, the bonding strength between the first portion 48*a* and the second portion 48*b* can be more reliably increased, and hermetic sealing can be more reliably performed. In addition, hermetic sealing can be performed more reliably without the use of a bonding agent including, for example, Sn or the like between the first portion 48*a* and second portion 48*b*. Therefore, productivity can be effectively improved.

Similarly, in the first portion 48*a* as well, the areas of all of the layers other than the first layer 48*g* are larger than the area of the first layer 48*g*. Therefore, the bonding strength between the first portion 48*a* and the second portion 48*b* can be more reliably increased, and hermetic sealing can be even more reliably performed.

As illustrated in FIG. 11, it is preferable that the farther away a layer is from the layers of the first integrated portion, the greater the area of the layer is. More specifically, it is preferable that the area of the third layer 48*i* of the first portion 48*a* is greater than the area of the second layer 48*h* and that the area of the second layer 48*h* is greater than the area of the first layer 48*g*. It is preferable that the area of the third layer 48*f* of the second portion 48*b* is greater than the area of the second layer 48*e*, and that the area of the second layer 48*e* is greater than the area of the first layer 48*d*. In this way, the planar accuracy of the first layer 48*g* of the first portion 48*a* and the first layer 48*d* of the second portion 48*b* can be more reliably improved. Therefore, variations in the bonding area between the first portion 48*a* and the second portion 48*b* can be more reliably and effectively reduced.

The first integrated portion is preferably made of Au, for example. In this case, the electrical resistance can be reduced.

Either the first portion 48*a* or the second portion 48*b* may be a multilayer body. In this case, it is preferable that the one of the first portion 48*a* and the second portion 48*b* that includes the portion having the smaller area of the portions included in a first bonding portion is a multilayer body. In this manner, the bonding area between the first portion 48*a* and the second portion 48*b* can be reduced, and the acoustic wave device can be easily reduced in size.

Figure 12:
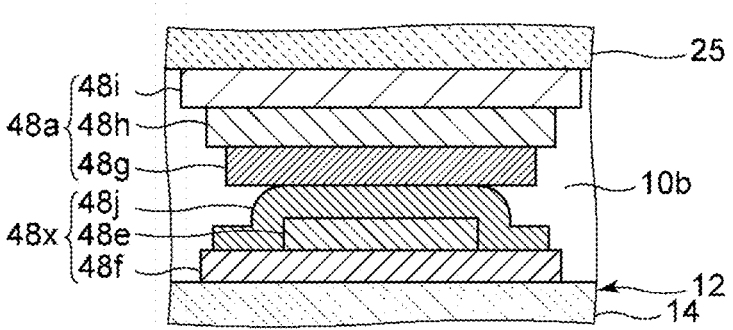
FIG. 12 is a schematic cross-sectional view illustrating the vicinity of a first support in a modification of the Third Preferred Embodiment of the present invention.

In the second portion 48*b*, the area of at least one layer other than the first layer 48*d* may be larger than the area of the first layer 48*d*. This also applies to the first portion 48*a*. In a modification of the Third Preferred Embodiment illustrated in FIG. 12, the areas of the layers of a second portion 48*x* decrease in the order of a third layer 48*f*, a first layer 48*j*, and a second layer 48*e*. The first layer 48*j* is provided on the third layer 48*f* so as to cover the second layer 48*e*. In this case as well, the first layer 48*j* can be easily provided on the third layer 48*f*, and planar accuracy of a portion of the first layer 48*j* positioned on the second layer 48*e* can be improved. In addition, in this modification as well, similarly to as in the Third Preferred Embodiment, sticking of a piezoelectric layer to a support can be reduced or prevented.

In preferred embodiments of the present invention, it is sufficient that at least one frame-shaped support such as the first support 48 is provided. In the Third Preferred Embodiment, the configuration of the first support 48 provided between the piezoelectric substrate 12 and the lid 25 is described. At least one frame-shaped support may include a support provided between a support substrate and a piezoelectric layer. Hereafter, a frame-shaped support provided between a support substrate and a piezoelectric layer is referred to as a third support. An example in which a third support is configured in the same or substantially the same manner as the first support 48 is described in a Fourth Preferred Embodiment of the present invention.

Figure 13:
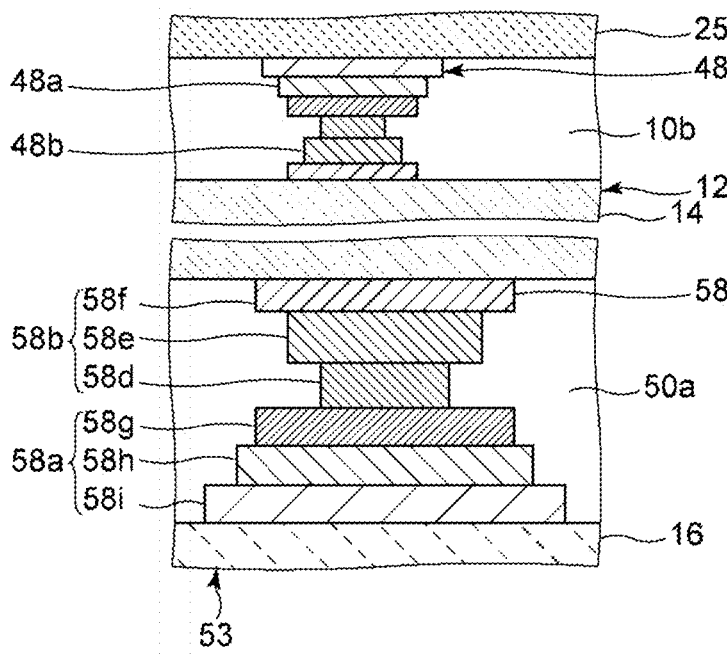
FIG. 13 is a schematic cross-sectional view illustrating the vicinity of a first support and a third support in a Fourth Preferred Embodiment of the present invention.

FIG. 13 is a schematic cross-sectional view illustrating the vicinity of a first support and a third support in the Fourth Preferred Embodiment.

The present preferred embodiment differs from the Third Preferred Embodiment in that a support 53 does not includes an intermediate layer but does include a third support 58. In other respects, the acoustic wave device of the present preferred embodiment has the same or substantially the same configuration as the acoustic wave device of the Third Preferred Embodiment.

The third support 58 is provided on the support substrate 16. The piezoelectric layer 14 is provided on the third support 58. The third support 58 has a frame shape. In the present preferred embodiment, a first cavity 50*a* is surrounded by the piezoelectric layer 14, the third support 58, and the support substrate 16. The height of the third support 58 is greater than the height of the first support 48. Therefore, in the present preferred embodiment as well, the height of the first cavity 50*a* is greater than the height of the second cavity 10*b*. Therefore, sticking of the piezoelectric layer 14 to the support 53 can be reduced or presented.

The support 53 may include at least one fourth support. In this case, the fourth support is, for example, disposed so as to overlap the second support in plan view. The fourth support is provided on the support substrate 16. The piezoelectric layer is provided on the fourth support.

The third support 58 is configured in the same or substantially the same manner as the first support 48 except for the size. Specifically, the third support 58 includes a first portion 58*a* and a second portion 58*b*. Of the first portion 58*a* and the second portion 58*b*, the first portion 58*a* is located on the side near the support substrate 16 and the second portion 58*b* is located on the side near the piezoelectric layer 14. In other words, the second portion 58*b* is disposed nearer the piezoelectric layer 14 than the first portion 58*a* in the height direction.

In the third support 58, both of the first portion 58*a* and the second portion 58*b* are multilayer bodies. Specifically, the first portion 58*a* includes a first layer 58*g*, a second layer 58*h*, and a third layer 58*i*. The second portion 58*b* includes a first layer 58*d*, a second layer 58*e*, and a third layer 58*f*. However, the number of layers of the first portion 58*a* and the second portion 58*b* may be 2 or 3 or more.

In the first portion 58*a*, the first layer 58*g*, the second layer 58*h*, and the third layer 58*i* are stacked in order. The first layer 58*g* is the portion of the first portion 58*a* closest to the second portion 58*b*. Similarly, in the second portion 58*b*, the first layer 58*d*, the second layer 58*e*, and the third layer 58*f* are stacked in order. The first layer 58*d* is the portion of the second portion 58*b* closest to the first portion 58*a*. The first layer 58*g* of the first portion 58*a* and the first layer 58*d* of the second portion 58*b* are made of the same material. A first integrated portion includes the first layer 58*g* of the first portion 58*a* and the first layer 58*d* of the second portion 58*b*.

Hereafter, the area of each portion of the third support 58 in plan view is simply referred to as area. In the second portion 58*b*, the areas of all of the layers other than the first layer 58*d* are larger than the area of the first layer 58*d*. The area of at least one layer other than the first layer 58*d* may be larger than the area of the first layer 58*d*. Consequently, the planar accuracy of the first layer 58*d* can be improved. Therefore, the bonding strength between the first portion 58*a* and the second portion 58*b* can be more reliably increased, and hermetic sealing can be more reliably performed.

Similarly, in the first portion 58*a* as well, the areas of all of the layers other than the first layer 58*g* are larger than the area of the first layer 58*g*. The area of at least one layer other than the first layer 58*g* may be larger than the area of the first layer 58*g*.

Consequently, the planar accuracy of the first layer 58*g* can be improved.

It is preferable that the farther away a layer is from the layers of the first integrated portion, the greater the area of the layer is. More specifically, it is preferable that the area of the third layer 58*i* of the first portion 58*a* is greater than the area of the second layer 58*h* and that the area of the second layer 58*h* is greater than the area of the first layer 58*g*. It is preferable that the area of the third layer 58*f* of the second portion 58*b* is greater than the area of the second layer 58*e*, and that the area of the second layer 58*e* is greater than the area of the first layer 58*d*. In this manner, the planar accuracy of the first layer 58*g* of the first portion 58*a* and the first layer 58*d* of the second portion 58*b* can be more reliably improved. Therefore, variations in the bonding area between the first portion 58*a* and the second portion 58*b* can be more reliably and effectively reduced.

Either the first portion 58*a* or the second portion 58*b* may be a multilayer body. In this case, it is preferable that the one of the first portion 58*a* and the second portion 58*b* that includes a portion having the smaller area of the portions included in the bonding portion be a multilayer body. In this way, the bonding area between the first portion 58*a* and the second portion 58*b* can be reduced, and the acoustic wave device can be easily reduced in size.

The area of the first cavity 50*a* may be made smaller than the area of the second cavity 10*b* by adjusting the size and arrangement of the third support 58. The area of the first cavity 50*a* is the area in plan view of the portion surrounded by the third support 58 minus the area in plan view of the fourth support, if the fourth support is provided. For example, the area of the first cavity 50a may be reduced by making the fourth support portion wall-shaped. In this way, the fragility of the acoustic wave device can be reduced without interfering with the excitation of acoustic waves.

It is sufficient that the height of the third support 58 is greater than the height of the first support 48. In a configuration where both of the first support 48 and the third support 58 are provided, the areas of the first cavity 50a and the second cavity 10b may be the same or substantially the same. For example, the height of the third support 58 may be made greater than the height of the first support 48 by making the thickness of at least one layer of the third support 58 greater than the thickness of at least one layer of the first support 48. Alternatively, the height of the third support 58 may be made greater than the height of the first support 48 by making the number of layers of the third support 58 greater than the number of layers of the first support 48.

An intermediate layer made of, for example, a dielectric or the like may be provided between the support substrate 16 and the third support 58, or between the piezoelectric layer 14 and the third support 58. Thus, the support 53 may include an intermediate layer.

Figure 14:
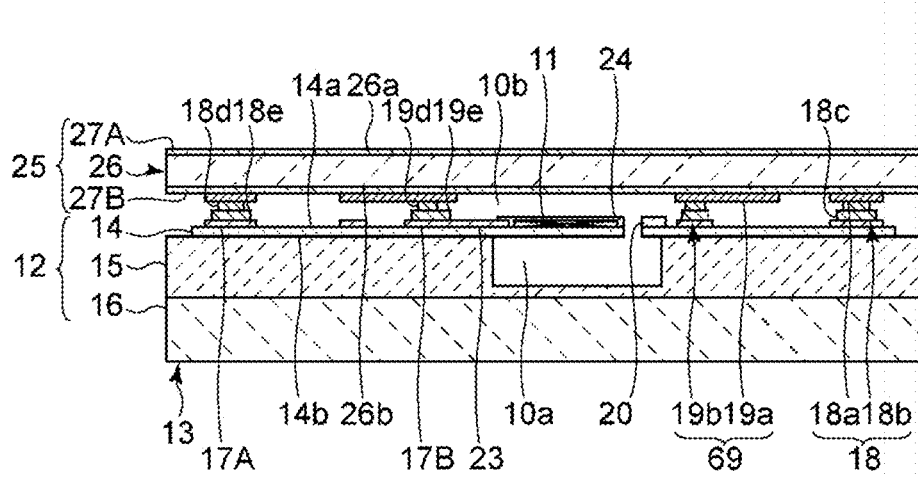
FIG. 14 is a schematic cross-sectional view illustrating portion of an acoustic wave device according to a Fifth Preferred Embodiment of the present invention corresponding to FIG. 1.

FIG. 14 is a schematic cross-sectional view illustrating portion of an acoustic wave device according to a Fifth Preferred Embodiment of the present invention corresponding to FIG. 1.

The present preferred embodiment differs from the First Embodiment with respect to the configuration of a second support 69. The present preferred embodiment also differs from the First Preferred Embodiment in that the second support 69 illustrated in FIG. 14 is not connected to a via electrode. In other respects, the acoustic wave device of the present preferred embodiment has the same or substantially the same configuration as the acoustic wave device 10 of the First Preferred Embodiment.

Similarly to the First Preferred Embodiment, a first integrated portion includes the first portion 18a and the first layer 18d of the second portion 18b of the first support 18. A second integrated portion includes the first portion 19a and the first layer 19d of the second portion 19b of the second support 69.

In the present preferred embodiment, the width of the first layer 19d portion of the second integrated portion in one second support 69 is smaller than the width of the narrowest portion of the first integrated portion of the first support 18. Thus, it is sufficient that the width of at least portion of the second integrated portion in at least one second support portion 69 is smaller than the width of the first integrated portion. Thus, the acoustic wave device can be easily reduced in size. The width of each portion of the second support 69 refers the dimension of each portion of the second support 69 along a direction perpendicular or substantially perpendicular to the direction in which the piezoelectric substrate 12, the second support 69, and the lid 25 are stacked.

The width of the portion of the second integrated portion that is smaller than the width of the first integrated portion is preferably greater than or equal to about 1 μm, for example. This enables the electrical resistance of the second support 69 to be reduced and the second support 69 can be providing as wiring.

The width of the portion of the second integrated portion that is smaller than the width of the first integrated portion is preferably less than about 16 μm, for example. Thus, the acoustic wave device can be more reliably reduced in size.

Therefore, in the present preferred embodiment as well, similarly to as in the First Preferred Embodiment, the height of the first cavity 10a is greater than the height of the second cavity 10b. Therefore, sticking of the piezoelectric layer 14 to the support 13 can be reduced or prevented.

Each acoustic wave resonator in the First to Fifth Preferred Embodiments or each modification is configured to use thickness-shear mode bulk waves, such as, for example, thickness-shear first order mode bulk waves. However, for example, each acoustic wave resonator may be configured to use plate waves or may be configured to use bulk waves other than thickness-shear mode bulk waves. Next, a case where the acoustic wave resonator is a bulk acoustic wave (BAW) device will be described.

Figure 15:
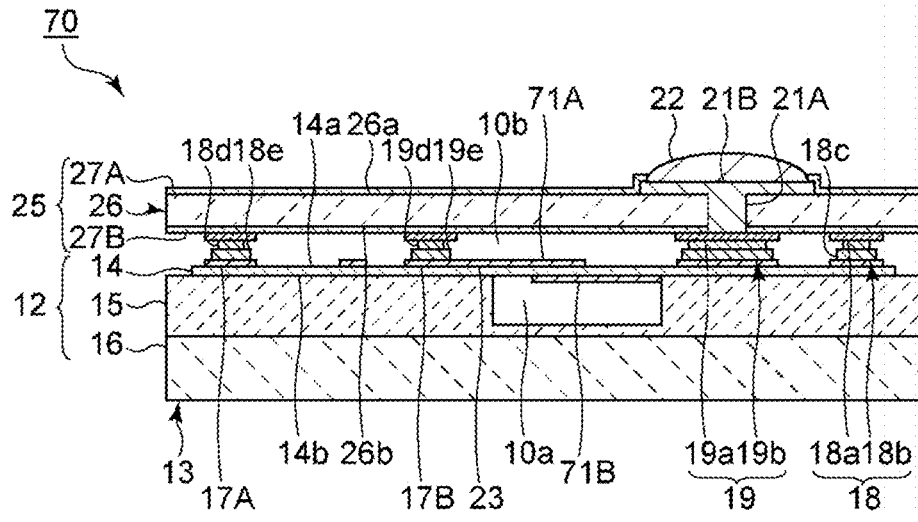
FIG. 15 is a schematic cross-sectional view illustrating portion of an acoustic wave device according to a Sixth Preferred Embodiment of the present invention corresponding to FIG. 1.

FIG. 15 is a schematic cross-sectional view illustrating portion of an acoustic wave device according to a Sixth Preferred Embodiment of the present invention corresponding to FIG. 1.

The present preferred embodiment differs from the First Preferred Embodiment in that the functional electrode includes an upper electrode 71A and a lower electrode 71B. The present preferred embodiment also differs from the First Preferred Embodiment in that the dielectric film 24 is not provided. In other respects, an acoustic wave device 70 of the present preferred embodiment has the same or substantially the same configuration as the acoustic wave device 10 of the First Preferred Embodiment.

The upper electrode 71A is provided on the first main surface 14a of the piezoelectric layer 14. The lower electrode 71B is provided on the second main surface 14b of the piezoelectric layer 14. The upper electrode 71A and the lower electrode 71B face each other across the piezoelectric layer 14. The upper electrode 71A and the lower electrode 71B are connected to different potentials from each other. The region across which the upper electrode 71A and the lower electrode 71B face each other is an excitation region. Acoustic waves are excited in the excitation region by applying an AC electric field between the upper electrode 71A and the lower electrode 71B.

In the present preferred embodiment, the conductive films 17B, the wiring electrodes 23, and the upper electrode 71A are provided so as to be integrated with each other. However, the conductive films 17B, the wiring electrodes 23, and the upper electrode 71A may be provided as separate members.

The dielectric film 24 illustrated in FIG. 1 may be provided so as to cover the upper electrode 71A or the lower electrode 71B defining and functioning as an excitation electrode. In this case, the upper electrode 71A or lower electrode 71B is less likely to be damaged.

Therefore, in the present preferred embodiment as well, similarly to as in the First Preferred Embodiment, the height of the first cavity 10a is greater than the height of the second cavity 10b. As a result, sticking of the piezoelectric layer 14 to the support 13 can be reduced or prevented even when the piezoelectric layer 14 deforms convexly from the second cavity 10b side toward the first cavity 10a side.

Next, the thickness-shear mode and plate waves will be described in detail. The above IDT electrode 11 has the configuration of an IDT electrode as described below. "Electrode" in the term IDT electrode corresponds to electrode fingers. The support in the following example corresponds to a support substrate.

Figure 16A:
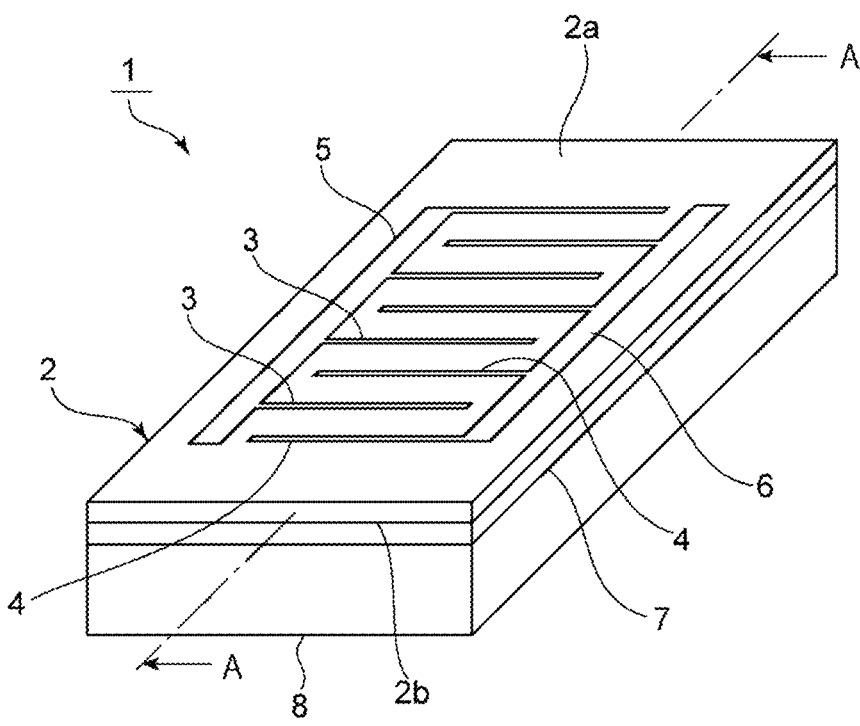
FIG. 16A is a schematic perspective view illustrating the exterior of an acoustic wave device using thickness-shear mode bulk waves.
Figure 16B:
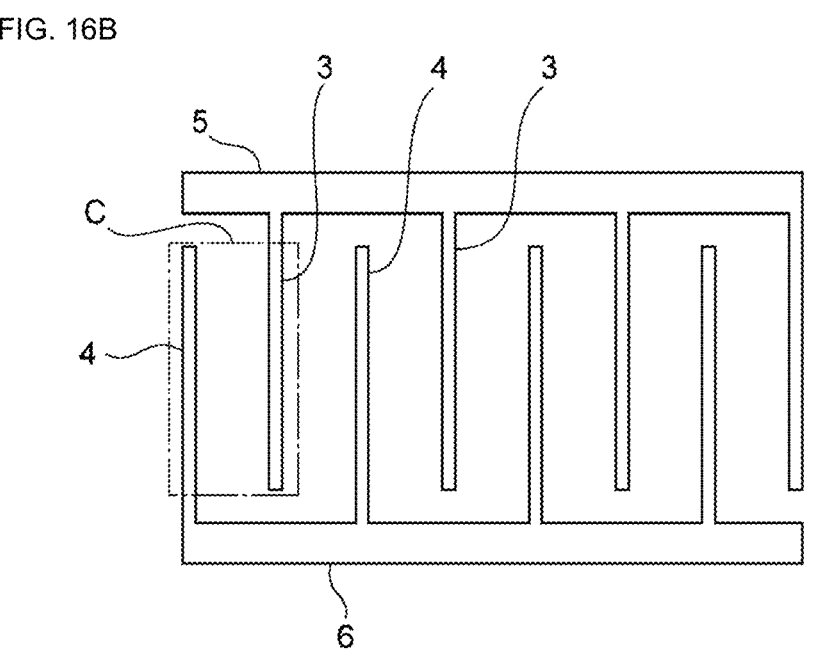
FIG. 16B is a plan view illustrating the electrode structure on a piezoelectric layer.

FIG. 16A is a schematic perspective view illustrating the exterior of an acoustic wave device using thickness-shear mode bulk waves. FIG. 16B is a plan view illustrating the electrode structure on a piezoelectric layer. FIG. 17 is a sectional view taken along line A-A in FIG. 16A.

An acoustic wave device 1 includes a piezoelectric layer 2 made of, for example, LiNbO₃. The piezoelectric layer 2 may instead be made of, for example, LiTaO₃. The cut angle of LiNbO₃ and LiTaO₃ is a Z-cut angle, but may instead be a rotated Y-cut or X-cut angle. The thickness of the piezoelectric layer 2 is not particularly limited, but is preferably, for example, greater than or equal to about 40 nm and less than or equal to about 1000 nm, and more preferably greater than or equal to about 50 nm and less than or equal to about 1000 nm in order to effectively excite a thickness-shear mode. The piezoelectric layer 2 includes first and second main surfaces 2a and 2b, which face each other. Electrodes 3 and electrodes 4 are provided on the first main surface 2a. Here, the electrodes 3 are an example of a "first electrode" and the electrodes 4 are an example of a "second electrode". In FIGS. 16A and 16B, a plurality of electrodes 3 are connected to a first bus bar 5. A plurality of electrodes 4 are connected to a second busbar 6. The plurality of electrodes 3 and the plurality of electrodes 4 are interdigitated with each other. The electrodes 3 and 4 are rectangular or substantially rectangular in shape and have a longitudinal direction. An electrode 3 and an adjacent electrode 4 face each other in a direction perpendicular or substantially perpendicular to this longitudinal direction. Both of the longitudinal direction of the electrodes 3 and 4 and the direction perpendicular or substantially perpendicular to the longitudinal direction of the electrodes 3 and 4 intersect the thickness direction of the piezoelectric layer 2. Therefore, the electrode 3 and the adjacent electrode 4 can be said to face each other in a direction that intersects the thickness direction of the piezoelectric layer 2. The longitudinal direction of the electrodes 3 and 4 may be interchanged with a direction perpendicular or substantially perpendicular to the longitudinal direction of the electrodes 3 and 4 illustrated in FIGS. 16A and 16B. In other words, in FIGS. 16A and 16B, the electrodes 3 and 4 may extend in the direction in which the first busbar 5 and second busbar 6 extend. In this case, the first busbar 5 and second busbar 6 would extend in the direction in which the electrodes 3 and 4 extend in FIGS. 16A and 16B. A pair structure includes an electrode 3 connected to one potential and an electrode 4 connected to another potential that are adjacent to each other, and a plurality of these pair structures are provided in a direction perpendicular or substantially perpendicular to the longitudinal direction of the electrodes 3 and 4. Here, an electrode 3 and an electrode 4 are adjacent to each other does not mean that the electrode 3 and the electrode 4 are disposed so as to be in direct contact with each other, but rather that the electrode 3 and the electrode 4 are disposed with a spacing therebetween. When an electrode 3 and an electrode 4 are adjacent to each other, no electrodes connected to a hot electrode or a ground electrode, including other electrodes 3 and 4, are disposed between the electrodes 3 and 4. The number of pairs does not have to be an integer number of pairs, and may be 1.5 pairs, 2.5 pairs, and so on. The distance between the centers of the electrodes 3 and 4, i.e., the pitch is preferably, for example, greater than or equal to about 1 μm and less than or equal to about 10 μm. The width of the electrodes 3 and 4, i.e., the dimension in the direction in which the electrodes 3 and 4 face each other is preferably in a range of, for example, greater than or equal to about 50 nm and less than or equal to about 1000 nm, and more preferably in a range greater than or equal to about 150 nm and less than or equal to about 1000 nm. The distance between centers of the electrodes 3 and 4 is the distance between the center of the dimension (width dimension) of the electrode 3 in a direction perpendicular or substantially perpendicular to the longitudinal direction of the electrode 3 and the center of the dimension (width dimension) of the electrode 4 in a direction perpendicular or substantially perpendicular to the longitudinal direction of the electrode 4.

Since a Z-cut piezoelectric layer is used in the acoustic wave device 1, the direction perpendicular or substantially perpendicular to the longitudinal direction of the electrodes 3 and 4 is perpendicular or substantially perpendicular to the polarization direction of the piezoelectric layer 2. This is not the case if a piezoelectric layer of another cut angle is used as the piezoelectric layer 2. Here, "perpendicular" is not limited to meaning strictly perpendicular, and can also mean substantially perpendicular (the angle between the direction perpendicular to the longitudinal direction of the electrodes 3 and 4 and the polarization direction may lie within a range of about 90°±10° for example).

A support 8 is stacked on the second main surface 2b side of the piezoelectric layer 2 with an insulating layer 7 interposed therebetween. The insulating layer 7 and the support 8 have a frame shape and include through holes 7a and 8a as illustrated in FIG. 17. In this way, a cavity 9 is provided. The cavity 9 is provided so as not to interfere with the vibration of an excitation region C of the piezoelectric layer 2. Therefore, the support 8 is stacked on the second main surface 2b with the insulating layer 7 interposed therebetween at a position where the support 8 does not overlap a portion where at least a pair of electrodes 3 and 4 is provided. The insulating layer 7 does not need to be provided. Thus, the support 8 can be directly or indirectly stacked on the second main surface 2b of the piezoelectric layer 2.

The insulating layer 7 is made of, for example, silicon oxide. However, in addition to silicon oxide, other suitable insulating materials such as, for example, silicon oxynitride and alumina can be used. The support 8 is made of, for example, Si. The plane orientation of Si on the piezoelectric layer 2 side may be (100) or (110), or even (111). The Si of the support 8 preferably has a high resistance equivalent to a resistivity of, for example, about 4 kΩcm or more. However, the support 8 may also be made of an appropriate insulating or semiconductor material.

For example, a piezoelectric material such as aluminum oxide, lithium tantalate, lithium niobate, or quartz, any of various ceramic materials such as alumina, magnesia, sapphire, silicon nitride, aluminum nitride, silicon carbide, zirconia, cordierite, mullite, steatite, or forsterite, a dielectric material such as diamond or glass, or a semiconductor such as gallium nitride can be used as the material of the support 8.

The plurality of electrodes 3 and 4 and the first and second busbars 5 and 6 are made of a suitable metal or alloy such as, for example, Al or an AlCu alloy. In the present preferred embodiment, the electrodes 3 and 4 and first and second busbars 5 and 6 have a structure in which, for example, an Al film is stacked on a Ti film. An adhesive layer other than a Ti film may be used.

When driving is performed, an AC voltage is applied between the plurality of electrodes 3 and the plurality of electrodes 4. More specifically, an AC voltage is applied between the first busbar 5 and the second busbar 6. In this way, resonance characteristics can be obtained using thickness-shear mode bulk waves excited in the piezoelectric layer 2. In the acoustic wave device 1, when d represents the thickness of the piezoelectric layer 2 and p represents the distance between the centers of any adjacent electrodes 3 and 4 out of the plurality of pairs of electrodes 3 and 4, d/p is less than or equal to about 0.5, for example. Therefore, bulk waves of a thickness-shear mode are effectively excited and good resonance characteristics can be obtained. More preferably, d/p is, for example, less than or equal to about 0.24, and in this case, even better resonance characteristics can be obtained.

As a result of the acoustic wave device 1 having the above configuration, even if the number of pairs of the electrodes 3 and 4 is reduced in order to facilitate miniaturization, the Q value is unlikely to decrease. This is because even if the number of electrode fingers in the reflectors on both sides is reduced, there is little propagation loss. The number of electrode fingers can be reduced because bulk waves of a thickness-shear mode are used. The difference between Lamb waves and thickness-shear mode bulk waves utilized in acoustic wave devices will be described while referring to FIGS. 18A and 18B.

FIG. 18A is a schematic elevational cross-sectional view for illustrating Lamb waves propagating through a piezo-electric film of an acoustic wave device as described in Japanese Unexamined Patent Application Publication No. 2012-257019. Here, a wave propagates through a piezoelec-tric film 201 as illustrated by the arrows. In the piezoelectric film 201, a first main surface 201a and a second main surface 201b are opposite each other, and the thickness direction connecting the first main surface 201a and the second main surface 201b is a Z direction. An X direction is the direction in which the electrode fingers of the IDT electrode are arrayed. As illustrated in FIG. 18A, a Lamb wave propagates in the X direction, as illustrated in FIG. 18A. The entire piezoelectric film 201 vibrates because plate waves are used and the waves propagate in the X direction, and therefore reflectors are disposed on both sides in order to obtain resonance characteristics. Therefore wave propagation loss occurs, and when size reduction is attempted, i.e., when the number of pairs of electrode fingers is reduced, the Q value falls.

In contrast, as illustrated in FIG. 18B, in the acoustic wave device 1, vibration displacement occurs in the thick-ness shear direction, and therefore the waves propagate and resonate substantially in a direction connecting the first and second main surfaces 2a and 2b of the piezoelectric layer 2 to each other, i.e., the Z direction. In other words, the x-direction component of the waves is significantly smaller than the z-direction component of the waves. Since reso-nance characteristics are obtained by propagation of waves in the Z direction, propagation loss is unlikely to occur even if the number of electrode fingers of the reflectors is reduced. Furthermore, even if the number of pairs of electrodes consisting of the electrodes 3 and 4 is reduced in order to facilitate size reduction, the Q value is unlikely to decrease.

Figure 19:
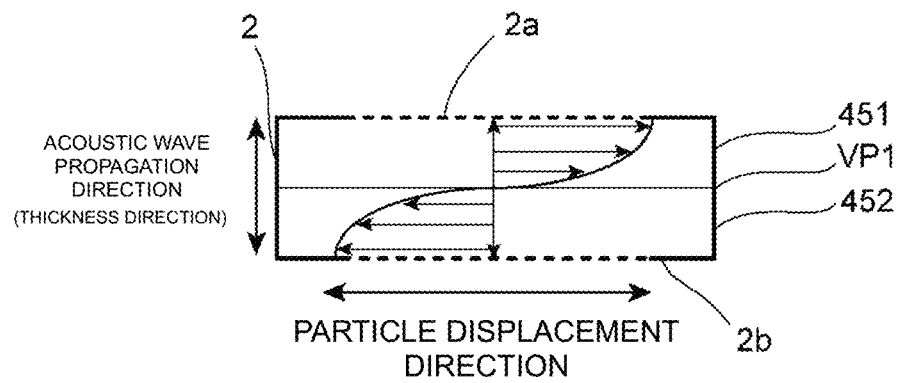
FIG. 19 illustrates the amplitude direction of thickness-shear mode bulk waves.

Bulk waves of the thickness-shear mode have opposite amplitude directions in a first region 451, which is included in an excitation region C of the piezoelectric layer 2, and in a second region 452, which is included in the excitation region C, as illustrated in FIG. 19. In FIG. 19, the bulk wave is illustrated in a schematic manner for a case where a voltage is applied between an electrode 3 and an electrode 4, with the electrode 4 being at a higher potential than the electrode 3. The first region 451 is a region of the excitation region C between a virtual plane VP1, which is perpendicu-lar or substantially perpendicular to the thickness direction of the piezoelectric layer 2 and divides the piezoelectric layer 2 into two regions, and the first main surface 2a. The second region 452 is the region of the excitation region C between the virtual plane VP1 and the second main surface 2b.

As described above, at least one pair of electrodes includ-ing an electrode 3 and an electrode 4 is disposed in the acoustic wave device 1. However, since the waves do not propagate in the X direction, there does not need to be a plurality of pairs of electrodes consisting of these electrodes 3 and 4. In other words, at least one pair of electrodes is all that is required.

For example, the electrode 3 is an electrode connected to a hot potential and the electrode 4 is an electrode connected to the ground potential. However, the electrodes 3 may be connected to the ground potential and the electrodes 4 may be connected to the hot potential. In the present preferred embodiment, at least one pair of electrodes consists of an electrode connected to a hot potential and an electrode connected to the ground potential, as described above, and no floating electrodes are provided.

Figure 20:
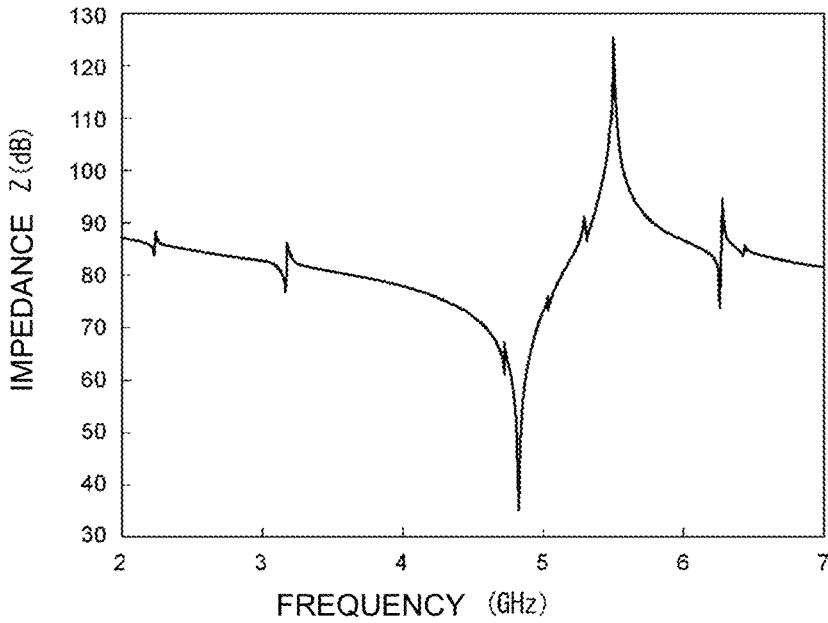
FIG. 20 illustrates the resonance characteristics of an acoustic wave device that uses thickness-shear mode bulk waves.

FIG. 20 illustrates the resonance characteristics of the acoustic wave device illustrated in FIG. 17. The design parameters of the acoustic wave device 1 with which these resonances characteristics were obtained are as follows.

Piezoelectric layer 2: LiNbO$_3$ with Euler angles (0°, 0°, 90°), thickness=about 400 nm.

When viewed in a direction perpendicular or substantially perpendicular to the longitudinal direction of the electrodes 3 and 4, the length of the region where the electrodes 3 and 4 overlap, i.e., the length of the excitation region C=about 40 μm, the number of pairs of electrodes consisting of the electrodes 3 and 4=21 pairs, the distance between the centers of the electrodes=about 3 μm, the width of the electrodes 3 and 4=about 500 nm, d/p=about 0.133.

Insulating layer 7: about 1 μm thick silicon oxide film. Support 8: Si.

The length of the excitation region C is the dimension along the longitudinal direction of the electrodes 3 and 4 in the excitation region C.

In the present preferred embodiment, the distance between electrodes of the electrode pairs including the electrodes 3 and 4 is equal or substantially equal in all of the plurality of pairs. In other words, the electrodes 3 and 4 are disposed at a uniform or substantially uniform pitch.

It is clear from FIG. 20 that good resonance characteris-tics with a relative bandwidth of about 12.5% are obtained despite there being no reflectors.

When d represents the thickness of the piezoelectric layer 2 and p represents the distance between the centers of the electrodes 3 and 4, in the present preferred embodiment, d/p is less than or equal to about 0.5, and more preferably less than or equal to about 0.24, as mentioned above. This will be described with reference to FIG. 21.

Figure 21:
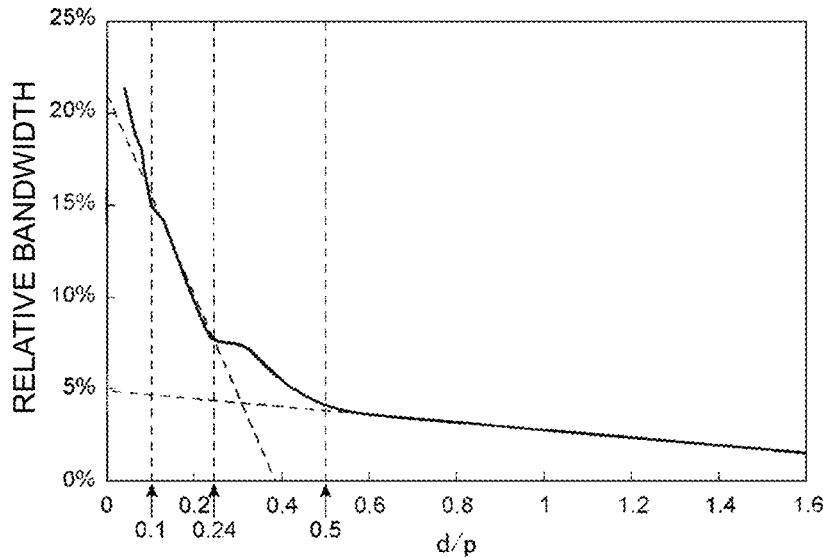
FIG. 21 illustrates the relationship between d/p and the relative bandwidth of a resonator when p is the distance between the centers of adjacent electrodes and d is the thickness of a piezoelectric layer.

A plurality of acoustic wave devices were obtained in the same or substantially the same manner as the resonance device in which the resonance characteristics illustrated in FIG. 20 were obtained except that d/p was varied. FIG. 21 illustrates the relationship between d/p and the relative bandwidth of an acoustic wave device serving as a resonator.

As is clear from FIG. 21, for d/p>about 0.5, the relative bandwidth is less than about 5%, even when d/p is adjusted. In contrast, when d/p≤about 0.5, if d/p is varied within this range, the relative bandwidth can be set to about 5% or more, i.e., a resonator with a high coupling coefficient can be configured. In addition, when d/p is about 0.24 or less, the relative bandwidth can be increased to about 7% or more. In addition, if d/p is adjusted within this range, a resonator with an even wider relative bandwidth can be obtained and a resonator with an even higher coupling coefficient can be realized. Therefore, it is clear that a resonator using thickness-shear mode bulk waves and has a high coupling coefficient can be configured by setting d/p to about 0.5 or less.

Figure 22:
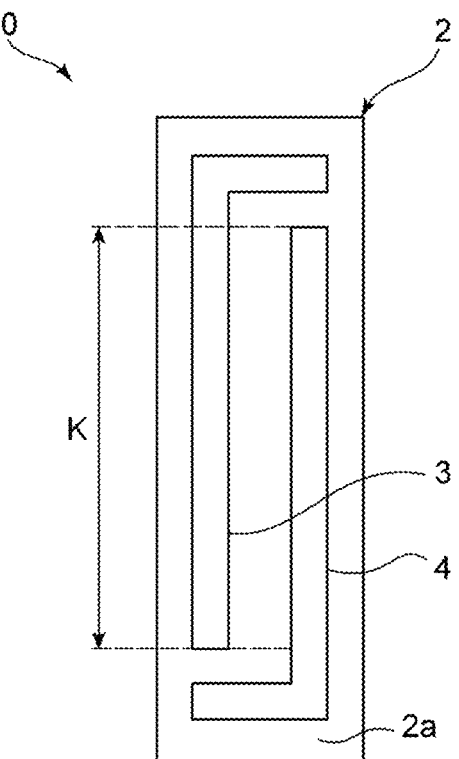
FIG. 22 is a plan view of an acoustic wave device that uses thickness-shear mode bulk waves.

FIG. 22 is a plan view of an acoustic wave device that uses thickness-shear mode bulk waves. In an acoustic wave device 80, one pair of electrodes, including an electrode 3 and an electrode 4, is provided on the first main surface 2a of the piezoelectric layer 2. K in FIG. 22 indicates the crossing width. As described above, the acoustic wave device of the present invention may include one pair of electrodes. In this case, as long as d/p is about 0.5 or less, bulk waves of the thickness-shear mode can be effectively excited.

Figure 23:
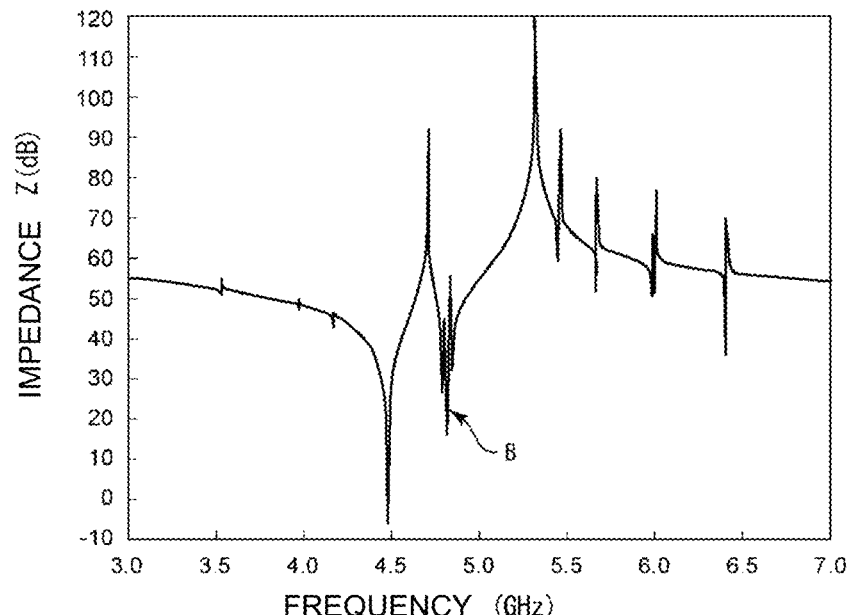
FIG. 23 illustrates the resonance characteristics of an acoustic wave device of a reference example in which a spurious emission appears.

In the acoustic wave device 1, a metallization ratio MR of adjacent electrodes 3 and 4 with respect to the excitation region C, which is the region in which any adjacent electrodes 3 and 4 out of the plurality of electrodes 3 and 4 overlap in the direction in which the electrodes 3 and 4 face each other, preferably satisfies MR≤1.75 (d/p)+0.075. In this case, spurious emissions can be effectively reduced. This will be explained while referring to FIGS. 23 and 24. FIG. 23 is a reference diagram illustrating an example of the resonance characteristics of the acoustic wave device 1. A spurious emission, as indicated by arrow B, appears between a resonant frequency and an anti-resonant frequency. Note that d/p=about 0.08 and Euler angles (0°, 0°, 90°) of LiNbO₃ were assumed. The metallization ratio MR=about 0.35 was used.

The metallization ratio MR will be described while referring to FIG. 16B. Focusing on one pair of electrodes 3 and 4, it is assumed that only one pair of electrodes 3 and 4 is provided in the electrode structure in FIG. 16B. In this case, the region surrounded by a single dot dashed line is the excitation region C. This excitation region C includes the region of the electrode 3 that overlaps the electrode 4, the region of electrode 4 that overlaps the electrode 3, and the region between the electrode 3 and the electrode 4 where the electrode 3 and the electrode 4 overlap, when the electrode 3 and the electrode 4 are viewed in a direction perpendicular or substantially perpendicular to the longitudinal direction of the electrodes 3 and 4. The metallization ratio MR is the ratio of the area of electrodes 3 and 4 within the excitation region C to the area of the excitation region C. That is, the metallization ratio MR is the ratio of the area of the metallization portion to the area of the excitation region C.

When a plurality of pairs of electrodes are provided, MR may be the ratio of the metallization portions included in the total excitation region to the total area of the excitation region.

Figure 24:
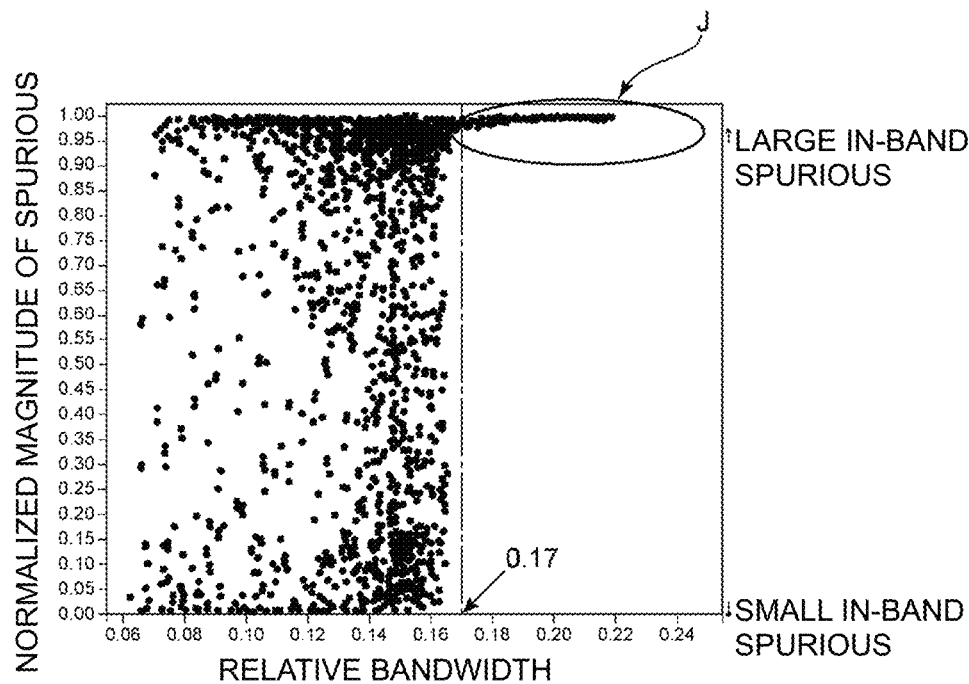
FIG. 24 illustrates the relationship between the relative bandwidth and the amount of phase rotation of the impedance of spurious normalized using 180 degrees as the magnitude of the spurious emission.

FIG. 24 illustrates the relationship between the relative bandwidth and the amount of phase rotation of the impedance of spurious normalized using about 180 degrees as the magnitude of the spurious emissions when a number of acoustic wave resonators are configured according to the present preferred embodiment. The relative bandwidth was adjusted by changing the film thickness of the piezoelectric layer and the dimensions of the electrodes to various values. FIG. 24 illustrates results for a piezoelectric layer made of Z-cut LiNbO₃, but a similar trend is observed for piezoelectric layers with other cut angles.

In the region enclosed by an oval J in FIG. 24, the spurious is as large as about 1.0, for example. It is clear from FIG. 24 that when the relative bandwidth exceeds about 0.17, i.e., about 17%, a large spurious emission of about 1 or more appear inside the passband, even when the parameters used to obtain the relative bandwidth are varied. In other words, a large spurious emission, as indicated by arrow B, appears inside the band, as in the resonance characteristics illustrated in FIG. 23. Therefore, the relative bandwidth is preferably about 17% or less, for example.

In this case, the spurious emission can be reduced by adjusting the film thickness of the piezoelectric layer 2 and the dimensions of the electrodes 3 and 4.

Figure 25:
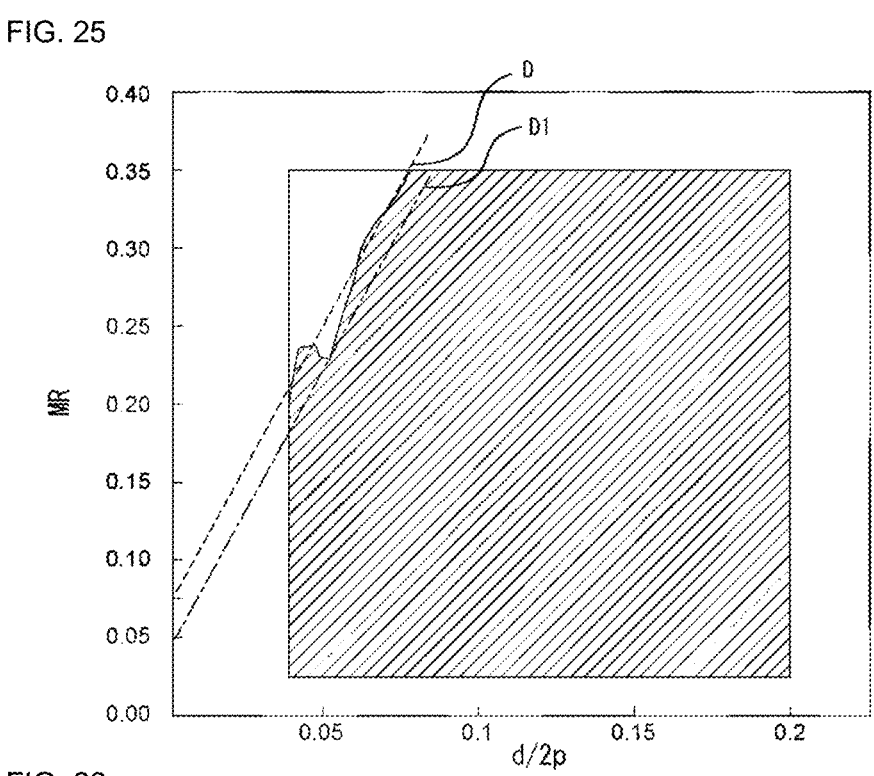
FIG. 25 illustrates the relationship between d/2p and a metallization ratio MR.

FIG. 25 illustrates the relationship between d/2p, the metallization ratio MR, and the relative bandwidth. For the above acoustic wave device, various acoustic wave devices with different d/2p and MR were configured and the relative bandwidths were measured. The area shaded with hatching on the right side of a dashed line D in FIG. 25 is the region where the relative bandwidth is about 17% or less. The boundary between the region shaded with hatching and the region not shaded with hatching is expressed as MR=3.5 (d/2p)+0.075. That is, MR=1.75 (d/p)+0.075. Therefore, preferably, MR≤1.75 (d/p)+0.075. In this case, the relative bandwidth is easily made about 17% or less. The region to the right of MR=3.5 (d/2p)+0.05 indicated by a single dot dashed line D1 in FIG. 25 is more preferable. In other words, if MR≤1.75 (d/p)+0.05, the relative bandwidth will reliably be about 17% or less.

Figure 26:
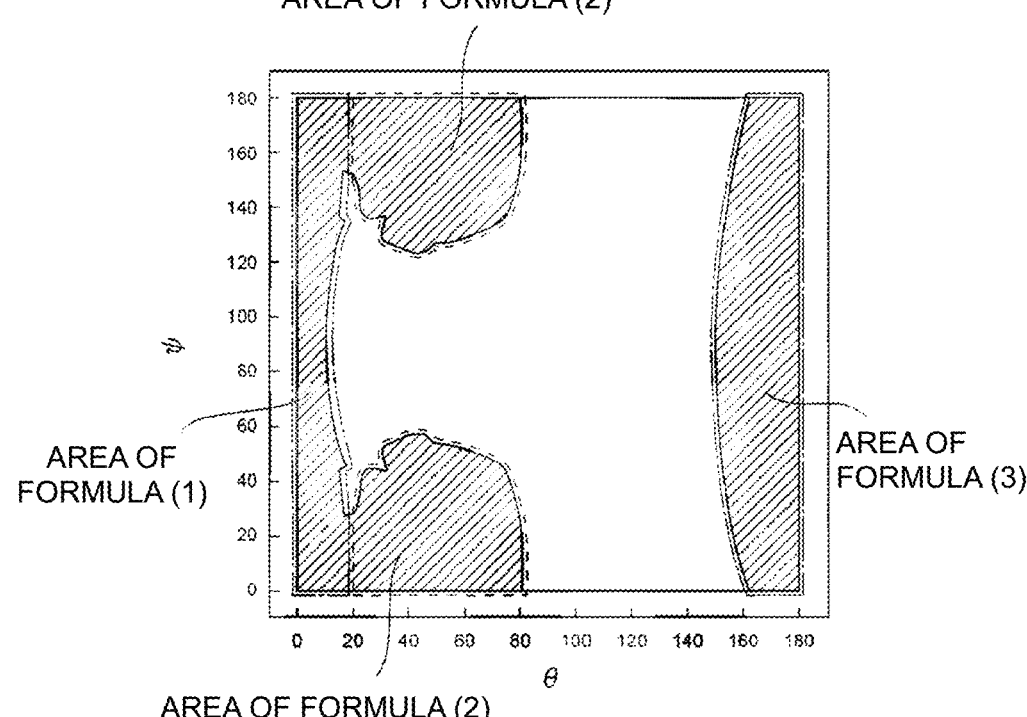
FIG. 26 illustrates a relative bandwidth map for the Euler angles (0°, θ, ψ) of LiNbO₃ when d/p is as close to 0 as possible.

FIG. 26 illustrates a relative bandwidth map for the Euler angles (0°, θ, ψ) of LiNbO₃ when d/p is as close to 0 as possible. The portion indicated with hatching in FIG. 26 is a region where a relative bandwidth of at least about 5% or more can be obtained, and the range of this region can be approximated using the following Formulas (1), (2), and (3).

$$(0°\pm10°,0° \text{ to } 20°, \text{any } \psi) \hspace{2cm} \text{Formula (1)}$$

$$(0°\pm10°,20° \text{ to } 80°,0° \text{ to } 60°(1-(θ-50)2/900)1/2) \text{ or} \\ (0°\pm10°,20° \text{ to } 80°,[180°-60°(1-(θ-50)2/900)1/ \\ 2] \text{ to } 180°) \hspace{2cm} \text{Formula (2)}$$

$$(0°\pm10°,[180°-30°(1-(\psi-90)2/8100)1/2] \text{ to } 180°,\text{any} \\ \psi) \hspace{2cm} \text{Formula (3)}$$

Therefore, the Euler angle range of Formula (1), (2) or (3) is preferable because this allows the relative bandwidth to be made sufficiently wide. This is also the case when the piezoelectric layer 2 is a lithium tantalate layer.

Figure 27:
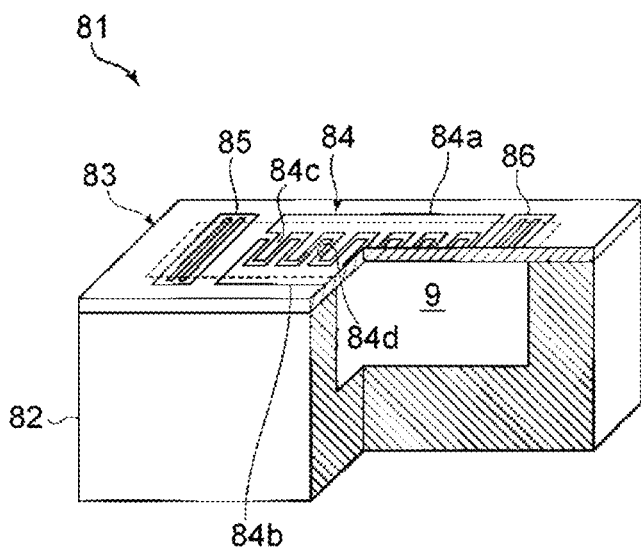
FIG. 27 is a partial cutout perspective view for describing an acoustic wave device that uses Lamb waves.

FIG. 27 is a partial cutout perspective view for describing an acoustic wave device that uses Lamb waves.

An acoustic wave device 81 includes a support substrate 82. An open recess is provided in the top surface of the support substrate 82. A piezoelectric layer 83 is stacked on the support substrate 82. Thus, a cavity 9 is provided. An IDT electrode 84 is provided on the piezoelectric layer 83 above the cavity 9. Reflectors 85 and 86 are provided on both sides of the IDT electrode 84 in an acoustic wave propagation direction. In FIG. 27, the outer edge of the cavity 9 is indicated by a dashed line. Here, the IDT electrode 84 includes first and second busbars 84a and 84b, a plurality of first electrode fingers 84c, and a plurality of second electrode fingers 84d. The plurality of first electrode fingers 84c are connected to the first busbar 84a. The plurality of second electrode fingers 84d are connected to the second busbar 84b. The plurality of first electrode fingers 84c and the plurality of second electrode fingers 84d are interdigitated with each other.

In the acoustic wave device 81, Lamb waves are excited as plate waves by applying an AC electric field to the IDT electrode 84 above the cavity 9. Since the reflectors 85 and 86 are provided on both sides, resonance characteristics produced by Lamb waves can be obtained.

Thus, an acoustic wave device according to a preferred embodiment of the present invention may utilize plate waves. In this case, the IDT electrode 84, the reflector 85, and the reflector 86 illustrated in FIG. 27 may be provided on the piezoelectric layer in any of the First to Fifth Preferred Embodiments or the modifications.

In the acoustic wave devices of any of the First to Fifth Preferred Embodiments or modifications thereof that use thickness-shear mode bulk waves, it is preferable that d/p is, for example, about 0.5 or less and more preferably about 0.24 or less, as described above. This enables even better resonance characteristics to be obtained. In addition, in the acoustic wave devices of any of the First to Fifth Preferred Embodiments or modifications that use thickness-shear mode bulk waves, it is preferable that MR≤1.75 (d/p)+0.075 be satisfied, as described above. In this case, spurious emissions can be more reliably reduced or prevented.

In the acoustic wave devices of the First to Fifth Preferred Embodiments and each modification thereof that use thickness-shear mode bulk waves, the piezoelectric layer is preferably, for example, a lithium niobate layer or a lithium tantalate layer. The Euler angles ($\varphi$, $\theta$, $\psi$) of the lithium niobate or lithium tantalate of the piezoelectric layer preferably lie in the range defined by Formula (1), (2), or (3) given above. In this case, the relative bandwidth can be made sufficiently wide.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a piezoelectric substrate including a support including a support substrate and a piezoelectric layer on the support;
a functional electrode on the piezoelectric layer;
at least one support; and
a lid; wherein
one of the at least one support surrounds the functional electrode on the piezoelectric substrate and the lid is provided on the support;
the support includes a first cavity overlapping at least a portion of the functional electrode in plan view, and a second cavity surrounded by the piezoelectric substrate, the support, and the lid, the support being provided between the piezoelectric substrate and the lid; and
a height of the first cavity is greater than a height of the second cavity, when a height direction is a direction in which the piezoelectric substrate, the support between the piezoelectric substrate and the lid, and the lid are stacked and a height is a dimension in the height direction.

2. The acoustic wave device according to claim 1, further comprising:
a wiring electrode on the piezoelectric layer; wherein
at least portion of the wiring electrode overlaps the first cavity in plan view.

3. The acoustic wave device according to claim 2, wherein the wiring electrode extends across a portion of the piezoelectric layer overlapping the first cavity in plan view and a portion of the piezoelectric layer not overlapping the first cavity in plan view.

4. The acoustic wave device according to claim 1, wherein the piezoelectric layer includes a first main surface and a second main surface that face each other; and
the acoustic wave device further includes a dielectric film at least partially provided on portion of at least one of the first main surface and the second main surface, the portion overlapping the first cavity in plan view.

5. The acoustic wave device according to claim 4, wherein the second main surface is located on a side at which the support is located and the dielectric film is provided on the second main surface.

6. The acoustic wave device according to claim 1, wherein the support and the lid are separate elements, the support being provided between the piezoelectric substrate and the lid.

7. The acoustic wave device according to claim 1, wherein the lid includes a lid body including a semiconductor as a main component.

8. The acoustic wave device according to claim 1, wherein the support between the piezoelectric substrate and the lid, and the lid are made of resin and are integrated with each other.

9. The acoustic wave device according to claim 1, wherein the support includes a first portion and a second portion, the second portion being provided nearer to the piezoelectric layer in the height direction than the first portion.

10. The acoustic wave device according to claim 9, wherein the first portion and the second portion include different metals from each other.

11. The acoustic wave device according to claim 9, wherein
in the support, a portion of the first portion located nearest to the second portion and a portion of the second portion located nearest to the first portion are made of a same or substantially a same material;
an integrated portion is provided in which the portion of the first portion located nearest to the second portion and the portion of the second portion located nearest to the first portion are integrated with each other; and
an area in plan view of the portion of the first portion located nearest to the second portion and an area in plan view of the portion of the second portion located nearest to the first portion are different from each other.

12. The acoustic wave device according to claim 11, wherein
at least one of the first portion and the second portion is a multilayer body; and
in plan view, in the multilayer body, an area of at least one layer other than a layer included in the integrated portion is larger than an area of the layer included in the integrated portion.

13. The acoustic wave device according to claim 12, wherein areas in plan view of all layers other than a layer included in the integrated portion in the multilayer body are larger than the area of the layer included in the integrated portion.

14. The acoustic wave device according to claim 13, wherein in the multilayer body, the farther a layer is from a layer included in the integrated portion, the larger the area in plan view.

15. The acoustic wave device according to claim 12, wherein the multilayer body includes at least three layers.

16. The acoustic wave device according to claim 12, wherein one of the first portion and the second portion that includes a portion having a smaller area in plan view of portions included in the integrated portion is the multilayer body.

17. The acoustic wave device according to claim 12, wherein both of the first portion and the second portion are multilayer bodies.

18. The acoustic wave device according to claim 11, wherein the integrated portion is made of Au.

19. The acoustic wave device according to claim 9, wherein the support between the piezoelectric substrate and the lid is a first support;

the acoustic wave device further includes at least one second support on the piezoelectric substrate and located inside the second cavity;

the first support and the second support each include a first portion on a side at which the lid is located and a second portion on a side at which the piezoelectric substrate is located;

a first integrated portion is provided in which a portion of the first portion of the first support located nearest to the second portion and a portion of the second portion of the first support located nearest to the first portion are integrated with each other;

a second integrated portion is provided in which a portion of the first portion of the second support located nearest to the second portion and a portion of the second portion of the second support located nearest to the first portion are integrated with each other; and a width of at least a portion of the second integrated portion of the at least one second support is smaller than a width of the first integrated portion, when a width of each portion of the first support is a dimension of each portion of the first support along a direction perpendicular or substantially perpendicular to both of a direction in which the piezoelectric substrate, the first support, and the lid are stacked and a direction in which the first support extends on the piezoelectric substrate, and a width of each portion of the second support is a dimension of each portion of the second support along a direction perpendicular or substantially perpendicular to the direction in which the piezoelectric substrate, the second support, and the lid are stacked.

20. The acoustic wave device according to claim 19, wherein the second support is electrically connected to the functional electrode.

21. The acoustic wave device according to claim 19, wherein a width of the second integrated portion is greater than or equal to about 1 μm and less than about 16 μm.

22. The acoustic wave device according to claim 1, wherein an area of the second cavity in plan view is greater than an area of the first cavity in plan view.

23. The acoustic wave device according to claim 22, wherein the support between the piezoelectric substrate and the lid is a first support;

the acoustic wave device further includes at least one second support on the piezoelectric substrate and located inside the second cavity;

the second support does not overlap the first cavity in plan view; and an area of the second cavity in plan view is an area obtained by subtracting an area of the second support from an area of a portion surrounded by the first support.

24. The acoustic wave device according to claim 1, wherein the support between the piezoelectric substrate and the lid is a first support;

the acoustic wave device further includes at least one second support on the piezoelectric substrate and located inside the second cavity; and the at least one second support is provided between the first support and the functional electrode.

25. The acoustic wave device according to claim 1, wherein the support between the piezoelectric substrate and the lid is a first support;

the acoustic wave device further includes a plurality of second supports on the piezoelectric substrate and located inside the second cavity; and the plurality of second supports include at least one pair of second supports provided such that the functional electrode is interposed therebetween.

26. The acoustic wave device according to claim 1, wherein the support between the piezoelectric substrate and the lid is a first support;

the acoustic wave device further includes at least one second support on the piezoelectric substrate and located inside the second cavity; and the at least one second support includes a first portion on a side at which the lid is located and a second portion on a side at which the piezoelectric substrate is located, and the first portion and the second portion include different metals from each other.

27. The acoustic wave device according to claim 1, wherein the support between the piezoelectric substrate and the lid is a first support;

the acoustic wave device further includes at least one second support on the piezoelectric substrate and located inside the second cavity; and the second support has a wall shape or a column shape.

28. The acoustic wave device according to claim 27, further comprising:

a wiring electrode on the piezoelectric substrate; wherein the support includes a third cavity not connected to the first cavity, overlapping the wiring electrode in plan view, and not overlapping the second support or the functional electrode in plan view.

29. The acoustic wave device according to claim 1, wherein the at least one support includes only the support provided between the piezoelectric substrate and the lid.

30. The acoustic wave device according to claim 1, wherein the at least one support further includes a support between the support substrate and the piezoelectric layer.

31. The acoustic wave device according to claim 1, wherein the support includes an intermediate layer between the support substrate and the piezoelectric layer.

32. The acoustic wave device according to claim 1, wherein the support includes an intermediate layer between the support substrate and the piezoelectric layer; and at least portion of the first cavity is provided in the intermediate layer.

33. The acoustic wave device according to claim 1, wherein the piezoelectric layer is a lithium tantalate layer or a lithium niobate layer.

34. The acoustic wave device according to claim 1, wherein the functional electrode includes first and second busbars facing each other, a first electrode finger connected to the first busbar, and a second electrode finger connected to the second busbar.

35. The acoustic wave device according to claim 34, wherein the functional electrode is an IDT electrode including a plurality of the first electrode fingers and a plurality of the second electrode fingers.

36. The acoustic wave device according to claim 35, wherein the acoustic wave device has a structure to use plate waves.

37. The acoustic wave device according to claim 34, wherein the acoustic wave device has a structure to use thickness-shear mode bulk waves.

38. The acoustic wave device according to claim 37, wherein
  the piezoelectric layer is a lithium tantalate layer or a lithium niobate layer; and
  Euler angles ($\phi$, $\theta$, $\psi$) of the lithium niobate or lithium tantalate of the piezoelectric layer are within a range of Formula (1), (2), or (3) below:

$$(0°\pm10°,0° \text{ to } 20°,\text{any } \psi) \qquad \text{Formula (1)}$$

$$(0°\pm10°,20° \text{ to } 80°,0° \text{ to } 60°(1-(\theta-50)2/900)1/2) \text{ or}$$
$$(0°\pm10°,20° \text{ to } 80°,[180°-60°(1-(\theta-50)2/900)1/2] \text{ to } 180°) \qquad \text{Formula (2) or;}$$

$$(0°\pm10°,[180°-30°(1-(\psi-90)2/8100)1/2] \text{ to } 180°,\text{any } \psi) \qquad \text{Formula (3).}$$

39. The acoustic wave device according to claim 34, wherein d/p is about 0.5 or less, when d is a thickness of the piezoelectric layer and p is a distance between centers of adjacent ones of the first and second electrode fingers.

40. The acoustic wave device according to claim 39, wherein when an excitation region is a region where the adjacent ones of the first and second electrode fingers overlap when viewed in a direction in which the adjacent ones of the first and second electrode fingers face each other and MR is a metallization ratio of the plurality of electrode fingers to the excitation region, MR$\leq$1.75 (d/p)+0.075 is satisfied.

41. The acoustic wave device according to claim 39, wherein d/p is about 0.24 or less.

42. The acoustic wave device according to claim 1, wherein
  the piezoelectric layer includes a first main surface and a second main surface that face each other; and
  the functional electrode includes an upper electrode on the first main surface of the piezoelectric layer and a lower electrode on the second main surface of the piezoelectric layer, and the upper electrode and the lower electrode face each other across the piezoelectric layer.

\* \* \* \* \*